(12) United States Patent
Lillie et al.

(10) Patent No.: US 12,197,368 B2
(45) Date of Patent: *Jan. 14, 2025

(54) COMPONENT FIRMWARE INTERACTION USING HARDWARE REGISTERS

(71) Applicant: Intel Corporation, Santa Clara, CA (US)

(72) Inventors: Kevan A. Lillie, Chandler, AZ (US); Shlomi Lalush, Rishon Lezion (IL); Yaakov Dalsace, Jerusalem (IL); Adee Ofir Ran, Maayan Baruch (IL); Assaf Benhamou, Haifa (IL); David Golodni, Bat Yam (IL); Itay Tamir, Jerusalem (IL); Amir Laufer, Petach Tiqwa (IL)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/375,054

(22) Filed: Sep. 29, 2023

(65) Prior Publication Data

US 2024/0020256 A1 Jan. 18, 2024

Related U.S. Application Data

(63) Continuation of application No. 15/476,936, filed on Mar. 31, 2017, now Pat. No. 11,809,353.

(51) Int. Cl.
| | |
|---|---|
| *G06F 13/20* | (2006.01) |
| *G06F 9/4401* | (2018.01) |
| *G06F 13/16* | (2006.01) |
| *G06F 13/38* | (2006.01) |
| *G06F 30/18* | (2020.01) |

(52) U.S. Cl.
CPC .......... *G06F 13/382* (2013.01); *G06F 9/4411* (2013.01); *G06F 13/16* (2013.01); *G06F 13/20* (2013.01); *G06F 30/18* (2020.01); *G06F 2213/0024* (2013.01); *G06F 2213/0026* (2013.01)

(58) Field of Classification Search
CPC ........ G06F 13/00; G06F 13/382; G06F 30/18; G06F 9/4411; G06F 13/16; G06F 13/20; G06F 2213/0024; G06F 2213/0026
See application file for complete search history.

(56) References Cited

U.S. PATENT DOCUMENTS

| | | | |
|---|---|---|---|
| 9,094,333 B1* | 7/2015 | Klemin | ................... H04L 49/90 |
| 2008/0170586 A1* | 7/2008 | Huff | ........................ H04L 47/25 |
| | | | 370/463 |

(Continued)

*Primary Examiner* — Henry Tsai
*Assistant Examiner* — Kim T Huynh
(74) *Attorney, Agent, or Firm* — KDW Firm PLLC

(57) ABSTRACT

Techniques and apparatus to provide for interactions between system components are described. In one embodiment, an apparatus to provide a component interface, the apparatus comprising at least one memory, a first component comprising at least one register, logic, at least a portion of comprised in hardware, the logic to define at least one interface field stored in the at least one register, generate an interface with a second component based on the at least one interface field, and receive interface information from the second component via the interface, the interface information comprising at least one value for the at least one interface field.

20 Claims, 15 Drawing Sheets

(56) References Cited

U.S. PATENT DOCUMENTS

| | | | | |
|---|---|---|---|---|
| 2010/0177783 A1* | 7/2010 | Kumar | ............. | H04L 12/40006 370/438 |
| 2018/0027077 A1* | 1/2018 | Melodia | ................ | G16H 40/67 370/254 |

* cited by examiner

| Execution Log 805 | | |
|---|---|---|
| Logger Index 810 | FW State 815 | Pointer 820 |
| 0 | 0 <LANE_INIT/IDLE> | |
| 1 | 1 <WAIT_AN_8> | |
| 2 | 1 <WAIT_AN_8> | |
| 3 | 3 <TRAIN> | |
| 4 | 4 <ALEF> | 825 |
| 5 | 5 <WAIT_LINK_UP> | |
| 6 | 15 <DATA_MODE> | <-- ptr |
| 7 | 0 <LANE_INIT/IDLE> | |
| 8 | 0 <LANE_INIT/IDLE> | |
| 9 | 0 <LANE_INIT/IDLE> | |
| 10 | 0 <LANE_INIT/IDLE> | |
| ⋮ | ⋮ | |
| 29 | 0 <LANE_INIT/IDLE> | |

*FIG. 8*

COMPONENT FIRMWARE INTERACTION USING HARDWARE REGISTERS

CROSS-REFERENCE TO RELATED APPLICATIONS

This application claims the priority to U.S. patent application Ser. No. 15/476,936, filed on Mar. 31, 2017. The contents which is incorporated by reference in its entirety.

TECHNICAL FIELD

Embodiments herein generally relate to information processing, and more particularly, to managing firmware interactions of components of a computing system.

BACKGROUND

Computing systems include various components and devices that are required to communicate with each other to operate and perform functions of the computing device. Each type of component or device is generally configured to implement communication using specific hardware and/or software elements, such as hardware registers and/or firmware. Accordingly, components of conventional computing systems typically require customization and/or tuning to efficiently and effectively interact with other system components. For instance, a link management component may require customization and/or tuning to effectively communicate with a particular physical (PHY) layer of a device, such as a peripheral component interconnect (PCI) express (PCIe) device. Such customization and/or tuning for each type of potential or actual component of a computing system is inefficient and resource-intensive. Accordingly, computing system and component developers would benefit from components capable of flexible and extensible configuration to allow for communication with a wide array of other components without requiring costly and time-consuming customization and/or tuning.

BRIEF DESCRIPTION OF THE DRAWINGS

FIG. 8 illustrates an embodiment of an execution log.

DETAILED DESCRIPTION

Figure 1:
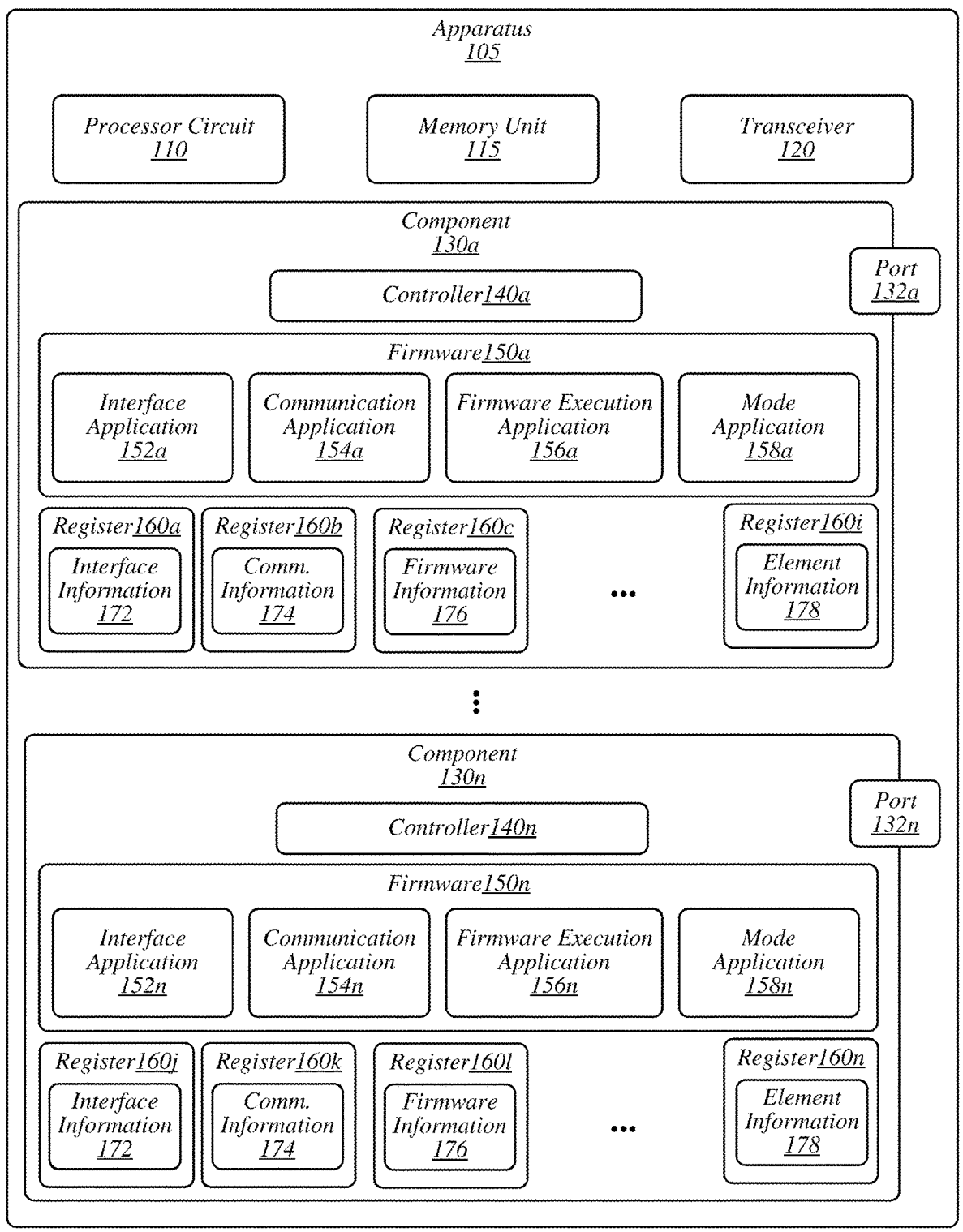
FIG. 1 illustrates an embodiment of a first operating environment.

Various embodiments may be generally directed to techniques for interaction between components of a computing system. Non-limiting examples of interactions may include data communications, interfacing, communication handshaking, execution tracking, and/or the like. Illustrative and non-limiting examples of components may include one or more elements of a communication protocol stack, a peripheral device or card, a processor, a memory device, a physical (PHY) component (or "layer") of a device, a link management component, and/or the like. In some embodiments, a dynamic interface may be provided for data communication between components. The dynamic interface may be defined in software (for instance, firmware) of a first component (for instance, a link management component) to operate via a plurality of hardware registers of a second component (for instance, a PHY component). In this manner, a controller of the first device may interface with a controller of the second device via the dynamic interface implemented using the plurality of hardware registers.

In some embodiments, a communication management process may operate to facilitate reliable communication between components being controlled by independent elements, such as independent controllers (or "microcontrollers"), over a communications interface. In various embodiments, the communication management process may be operative between independent controllers of communicating components via reading from and writing to a plurality of hardware registers of the components. In some embodiments, the communication management process may include one or more of a handshaking process, a timing requirements process, and/or a read/write partitioning process to avoid collisions between the controllers operating over the communications interface.

In various embodiments, an execution tracking application may operate to provide a logging process for tracking execution of component software, such as firmware of a computing system component. In some embodiments, a component may include, among other things, a plurality of hardware registers and a controller operative to execute firmware for controlling the component. In various embodiments, the plurality of hardware registers may be used to store an execution log for component software. In some embodiments, the execution log may include one or more states (or execution states) of the component software. In various embodiments, the execution log may include a current or active state of the component software indicated by, for example, a pointer. In this manner, execution of component software may be tracked using hardware registers that are accessible to the component software or other software applications, such as drivers, without having to rely on other memory devices, such as microcontroller random access memory (RAM).

In some embodiments, a mode application may operate to configure and/or support a plurality of operating modes of at least one element of a component, for example, via a firmware application operating on a processor (or microprocessor) of the component. In various embodiments, a component (for instance, a PHY component) may include a plurality of registers. In some embodiments, at least a portion of the registers may include hardware registers. At least one of the plurality of registers may include a configuration register operative to store mode information. Non-limiting examples of mode information may include mode type, speed/data rate, physical medium dependent (PMD) type, connection media type, connection media length, and/or the like. In various embodiments, a configuration register may store a mode type for an element of the component. Illustrative and non-restrictive modes for a port of the component may include (for instance, 10GBASE-T, 10GBASE-R, 10GBASE-KR, and/or the like), 40GBASE, 100GBASE, SFI, SGMII, and/or the like. Component firmware configures the port for the specified mode. In various embodiments, at least one configuration register may include mode information used to configure the port for the specified mode, such as parameters used to support the mode. In some embodiments, the firmware may determine whether an element is valid, for instance, to ensure that only properly configured and/or supported modes are enabled.

In conventional systems, each mode required an individual firmware application, each of which required separate development, validation, and the like. Accordingly, each firmware application was unique to a particular mode such that all ports controlled by a same controller (or microcontroller) and firmware had to enable the same mode of operation. However, in some embodiments, a single firmware application may support multiple modes and may operate to configure a port over multiple instances without requiring re-flashing or re-programming of the component and/or corresponding firmware. In addition, port configuration according to some embodiments may allow for different modes on adjacent ports of a component that are operated by a common firmware application being executed by a shared controller (or microcontroller).

FIG. 1 illustrates an example of an operating environment 100 that may be representative of various embodiments. The operating environment 100 depicted in FIG. 1 may include an apparatus 105 having a processor circuit 110, a memory unit 115, and a transceiver 120. Processor circuit 110 may include and or may access logic having instructions for performing operations according to some embodiments. Processor circuit 110 may be communicatively coupled to memory unit 115 and/or transceiver 120.

As shown in FIG. 1, apparatus 105 may include components 130a-n having a controller 140a-n and firmware 150a-n. Components 130a-n may include various hardware and/or software elements, components, devices, and/or the like. Non-limiting examples of components 130a-n may include a link management component, a PHY layer or component, and/or the like. In some embodiments, controllers 140a-n may include a microcontroller including circuitry capable of operating components 130a-n, for instance, by executing firmware 150a-n. Although a PHY component and a link management component are used as examples herein, embodiments are not so limited as other types of components capable of operating according to some embodiments are contemplated herein.

Firmware 150a-n may include various applications, algorithms, code, modules, routines, processes, and/or the like for operating component 130a-n. For example, firmware may include one or more of an interface application 152a-n, a communication application 154a-n, and a firmware execution application 156a-n. In some embodiments, interface application 152a-n may operate to provide an interface between components 130a-n. In various embodiments, communication application 154a-n may operate to facilitate communication between components 130a-n (for instance, "handshaking" of signals between components 130a-n). In some embodiments, firmware execution application 156a-n may operate to track, log, or otherwise monitor execution of firmware 150a-n.

As shown in FIG. 1, components 130a-n may each include a plurality of registers 160a-n. In some embodiments, registers 160a-n may include hardware registers operative to store information associated with firmware 150a-n and applications thereof. For example, registers 160a-n may be configured to store interface information 172 used by interface application 152a-n, communication information 172 used by communication application 154a-n, and/or firmware information 176 used by firmware execution application 156a-n. In some embodiments, registers 160a-n may store no information and/or information that is not associated with firmware 150a-n and/or applications thereof.

In various embodiments, interface information 172 may include any information, data, signals, or other element used by interface application 152a-n to provide an interface between components 130a-n. In some embodiments, interface information 172 may include fields that may be defined by interface application 152a-n. For example, interface information 172 may include fields defined by interface application 152a-n to configure ports associated with component 130a-n. In some embodiments, interface information 172 may include status information, for instance, of component 130a-n, elements of component 130a-n (such as a port (not shown)), firmware 150a-n, interface application 152a-n, and/or the like. Interface application 152a-n, through the use of registers 160a-n and interface information 172, may allow a first component 130a-n (for instance, a link management component) to interface with a plurality of different components 130a-n (for instance, a plurality of different PHY components). Accordingly, defining interfaces between components 130a-n in firmware 150a-n allows for such interfaces to be implemented within any system that uses microcontroller 140a-n and firmware 150a-n to operate. In this manner, the conventional requirement to modify a components 130a-n, such as a link management component, to operate with each type of other components 130a-n, such as each type of PHY component, has been removed.

Communication information 172 may generally include information used by communication application 154a-n to facilitate communication between components 130a-n. In some embodiments, communication information 172 may include fields, field values, bits, and/or the that may be used to configure firmware 150a-n. In some embodiments, the communication information 172 may relate to fields associated with functions of a communication process (for instance, a "handshaking process"). Non-limiting examples of such functions may include request, reset, acknowledge, and error. In this manner, flexible and dynamic software-based methods using hardware registers may be executed to define reliable interfaces between two different types of components 130a-n.

In general, firmware information 176 may include information associated with the execution of firmware 150a-n. For instance, firmware information 176 may include execution steps, methods, processes, segments, and/or the like associated with execution of firmware 150a-n. In some embodiments, firmware information 176 may include one or more indices associated with execution steps of firmware 150a-n. In some embodiments, firmware information 176 may include an execution log for execution steps of firmware 150a-n. In various embodiments, firmware information 176 may include a pointer to a current or active step being executed by firmware 150a-n. In this manner, firmware execution application 156a-n may operate to provide, among other things, an execution log of firmware 150a-n execution without the requirements of using special debug hardware, RAM, or other elements used by conventional systems. Accordingly, some embodiments may use existing hardware registers 160a-n to store an execution log such that any software or other process that can configure firmware execution application 156a-n can also access the registers 160a-n to read the firmware information 176 stored therein.

As shown in FIG. 1, firmware 150a-n may include a mode application 158a-n. In some embodiments, mode application 158a-n may operate to configure one of ports 132a-n using element information 178. In some embodiments, mode application 158a-n may be or may include an image or a binary file (for instance, a node version manager (NVM)). In some embodiments, registers 160a-n may include element information 178 indicating one or more modes for ports 132a-n. For instance, register 160i may store element information 178 that includes mode information for port 132a of component 130a. In various embodiments, element information 178 may be stored in a memory unit accessible to component 130a-n instead of or in addition to registers 160a-n. For example, element information 178 may be stored in a memory-mapped location in RAM (not shown) of controller 140a-n.

In some embodiments, mode information may indicate to firmware 150a port type specifications to implement a port type for port 132a, including, without limitation, a speed/data rate, a PMD type, a connection media type, a connection media length, and/or the like. In some embodiments, registers 160a-n may store element information 178 that includes configuration information specifying parameters for use by and/or for configuring ports 132a-n according to the specified mode. As an example, firmware 150a may determine a mode for port 132a based on mode information of element information 178 stored in register 160i. Firmware 150a may determine whether the port type is valid based on various factors, including component type, port type, supported modes, adjacent modes, devices communicatively coupled to port 132a, and/or the like. Firmware 150a may use configuration information of element information 178, stored in register 160i and/or one or more other registers, to configure component 130a and/or port 132a to operate according to the specified mode.

In various embodiments, element information 178 stored in register 160i and/or other registers 160a-i of component 130a, may be received from one or more other components, devices, elements, and/or the like. For instance, component 130a may include a PHY component and component 130n may include a link management component communicatively coupled to 130a. Firmware 150n, for instance, via mode application 158n, may write element information 178 into register 160i and/or other registers 160a-i of component 130a to specify a mode, operating parameters, and/or the like for port 132a.

Figure 2:
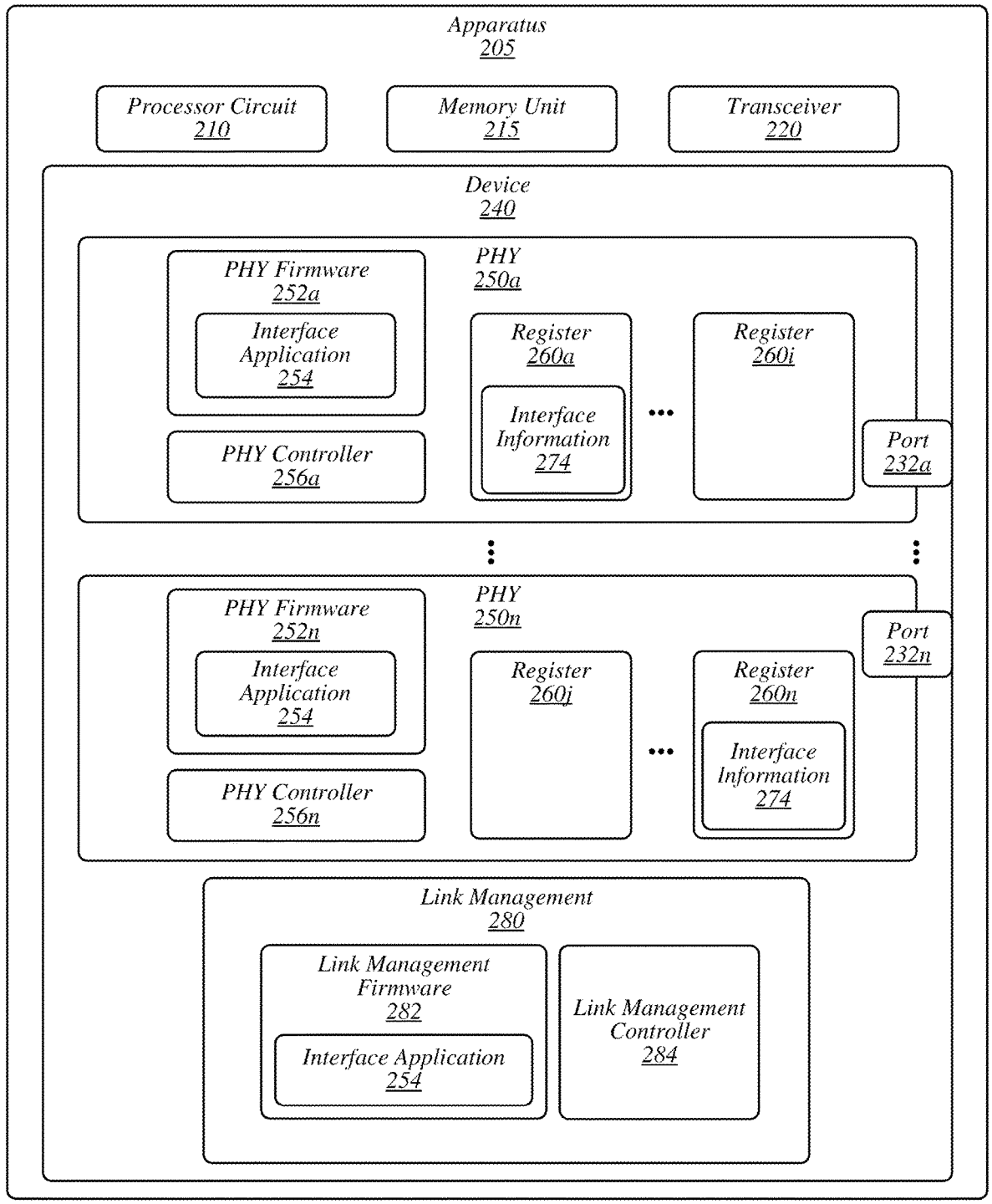
FIG. 2 illustrates an embodiment of a second operating environment.

FIG. 2 illustrates an example of an operating environment 200 that may be representative of various embodiments. The operating environment 200 depicted in FIG. 2 may include an apparatus 205 having a processor circuit 210, a memory unit 215, and a transceiver 220. Processor circuit 210 may include and or may access logic having instructions for performing operations according to some embodiments. Processor circuit 210 may be communicatively coupled to memory unit 215 and/or transceiver 220.

As shown in FIG. 2, apparatus 205 may include a device 240 having one or more PHY 250a-n components and a link management 280 component. In some embodiments, device 240 may include a peripheral component interconnect (PCI) express (PCIe) device, a communications device (for instance, a network interface controller (NIC)), a graphics device (for instance, a graphics controller device, peripheral card, system on a chip (SoC), and/or the like). In some embodiments, PHY 250a-n may include processing circuitry for physical link layer processing of receive/transmit signals for device 240 over various physical I/O links. Link management 280 may include circuitry, such as a link management controller 284, and software, such as link management firmware 282, for interfacing with PHY 250a-n and/or managing interfacing of PHY 250a-n and other communication protocols and/or communication layers. For instance, link management 280 may operate to support communication between PHY 250a-n and a PCIe communication protocol and/or a media access controller (MAC) and PHY 250a-n, such as a management data input/output (MDIO) interface of PHY 250a-n.

Although link management 280 and PHY 250a-n are depicted as being on the same device 240 in FIG. 2, embodiments are not so limited, as link management 280 and/or one or more of PHY 250a-n may be arranged on separate devices 240. In addition, although FIG. 2 depicts PHYs 250a-n and link management 280, embodiments are not so limited, as any type of component capable of operating according to some embodiments is contemplated herein. For example, any type of components that are independently controlled via a controller (or microcontroller) and firmware and which one component includes a plurality of registers may operate according to some embodiments.

Link management 280 may be communicatively coupled to a plurality of PHY 250a-n. In some embodiments, link management 280 may include a link management controller 284 operative to execute link management firmware 282 to operate link management 280. In some embodiments, link management firmware 282 may include an interface application 254 that may include software, processes, code, algorithms, and/or the like to provide an interface with PHY 250a-n. PHYS 250a-n may include a PHY controller 256a-n operative to execute PHY firmware 252a-n to operate PHY 250a-n. In some embodiments, PHY firmware 252a-n may include an interface application 254 that may include software, processes, code, algorithms, and/or the like to provide an interface with link management 280. Each of PHY 250a-n may include a plurality of registers 260a-n, for instance, hardware registers. Registers 260a-n may be operative to store bits, bytes, data, signals, or other information. In some embodiments, registers 260a-n may be operative to store, among other things, interface information 274. PHY 250a-n may be associated with ports 232a-n for communicating with other components, protocols, devices, and/or the like.

In some embodiments, link management 280 and one or more of PHY 250a-n may be operative to interface via registers 260a-n. For example, link management controller 247 of link management 280 may be operative to interface with one or more of ports 232a-n via registers 260a-n using interface application 254.

In various embodiments, operational information associated with PHY 250a-n may be determined by link management 280. In some embodiments, operational information may include any information required for link management 280 to interface, operate, communicate, or otherwise interact with PHY 250a-n, and vice versa. In some embodiments, operational information may include a mode of operation of PHY 250a-n. In some embodiments, operational information may be included in or otherwise accessible by link management firmware 282, for instance, in a memory unit, data store, and/or other data structure. In various embodiments, operational information may be generated, provided, configured, updated, modified, and/or the like during configuration of apparatus 205, device 240, and/or link management 280. In some embodiments, operational information may be provided, configured, updated, modified, and/or the like as part of a process for configuring and/or updating link management firmware 282 (including, interface application 254). In some embodiments, link management 280 may have access to operational information for a plurality of different types of PHYs 250a-n (or other components). In this manner, link management 280 may operate a plurality of different types of PHYs 250a-n using operational information specific for each type and/or requirements of a particular PHY 250a-n. Accordingly, link management 280 may add support for each type of PHY 250a-n via software (for instance, link management firmware 282) using hardware registers 260a-n.

In various embodiments, registers 260a-n may store interface information 274 in the form of one or more fields (or "interface fields") that may be defined by PHY firmware 252a-n and/or link management firmware 282 for each particular type, version, and/or the like of PHYs 250a-n. In some embodiments, PHY firmware 252a-n and/or link management firmware 282 may define certain of registers 260a-n to operate as a register 260a-n for a certain field. For example, register 260a may operate to hold interface information for a first field, register 260i may operate to hold interface information for a second field, and so on. Link management firmware 282, via interface application 254, may communicate operational information (for instance, a mode of operation) to PHY 250a-n by configuring the interface fields in registers 260a-n. For example, link management firmware 282 may provide certain types of interface fields and/or values of interface fields in registers 260a-n of PHY 250a-n based at least partially on the operational information associated with PHY 250a-n. In some embodiments, the interface fields and/or values for the interface fields may be defined independently of the characteristics of PHY 250a-n, such as PHY type, architecture, operation, and/or the like. The interface information 274 may include the interface fields and/or values for the interface fields. In some embodiments, the interface information 274 may be provided, generated, configured, modified, and/or the like by PHY 250a-n, link management 280, and/or a combination of PHY 250a-n and link management 280.

In one example, if PHY 250a and PHY 250n are different types of PHYs with different modes of operation, a first set of interface fields may be configured for PHY 250a and a second set of interface fields may be configured for PHY 250n, the first set of interface fields being different than the second set of interface fields. In some embodiments, the first set of interface fields and the second set of interface fields may be assigned different values. In another example, a same set of interface fields may be configured for PHY 250a and PHY 250n. In some embodiments, at least a portion of the same set of interface fields for PHY 250a may include different values than the same set of interface fields for PHY 250n. In some embodiments, the same set of interface fields for PHY 250a may include the same or substantially the same values as the same set of interface fields for PHY 250n, for instance, during an initial configuration. In some embodiments, the interface fields and/or the values of the interface fields may be modified by PHY firmware 252a-n and/or link management firmware 282 during operation of PHY 250a-n and/or link management 280.

In various embodiments, PHY firmware 252a-n, via interface application 254, may determine a value of one or more of the interface fields. PHY 250a-n may operate to configure one or more operational aspects of PHY 250a-n based on the values of the interface fields. For example, PHY firmware 252a-n may determine the value of an interface field and may configure one or more operational aspects of PHY 252a-n based on the value of the interface field and/or interface information passed to PHY 250a-n from link management 280.

The registers 260a-n and interface information, including interface fields and values of interface fields, may operate to form an interface between PHY 250a-n and link management 280, for instance, allowing interaction between PHY firmware 252a-n and link management firmware 282. Operating environment 200 operating according to some embodiments provides multiple technological advantages over conventional systems. One non-limiting example of a technological advantage is that link management 280 may function to interface with multiple types of PHYs 250a-n, for example, from different developers and/or having different configurations, using a standard converged interface. Another non-limiting example of a technological advantage is that the interface may be defined totally or at least partially in firmware and, therefore, may be provided in and/or incorporated into any component (for instance, any PHY 250a-n) using a controller (for instance, PHY controller 256a-n) and having register space (for instance, registers 260a-n). Conventional systems required link management firmware of a link management component to be modified and/or tuned for each type or configuration of component. More specifically, a link management component was required to unique for each system implementation, for example, based on which specific registers and/or sequences a particular component required in order to establish a link or component interface with the link management component. Accordingly, in some embodiments, a first component (for instance, one of PHY 250a-n) may operate to configure itself and to abstract the required component mode configuration from a second component (for instance, link management 280) to establish a component interface between the first component and the second component. In some embodiments, the component interface may include registers 260a-n, interface information 274 in registers 260a-n, any hardware and/or software elements required to allow link management 280 and/or PHYs 250a-n to read from and/or write to registers 260a-n.

Referring to operating environment 200, a consistent interface may be established between link management 280 and any of PHYs 250a-n, including PHYs 250a-n having different configurations. In some embodiments, operational information of PHYs 250a-n (for instance, PHY 250a-n configuration, port 232a-n configurations, and/or the like) may be abstracted from PHY firmware 252a-n functions such that link management firmware 282 may interface with PHYs 250a-n without being specifically modified to match such operational information. Non-limiting examples of PHY firmware 252a-n functions may include execution, sequences, calibration dependencies, hardware requirements, and/or the like.

In some embodiments, an interface may be established between link management 280 and any of PHYs 250a-n. Using PHY 250a as a non-limiting example, the interface may include any manner of providing for the transmission and/or reception of data, information, or other signals between link management 280 and PHY 250a. In some embodiments, link management 280 may have read and/or write access to at least a portion of registers 260a-i. In various embodiments, link management firmware 282, via interface application 254, may operate to provide interface information 274 to registers 260a-i, such as interface fields and/or values for interface fields. PHY 250a may configure certain operational information based on the interface information 274. In some embodiments, PHY 250a may include one or more configurable elements, such as port 232a. PHY 250a may configure the configurable element based on the interface information received from link management 280 (for example, a value of an interface field of registers 260a-i). For instance, PHY controller 256a may configure port 232a (for example, PHY port hardware for port 232a) based on the interface information 274 provided by link management 280 over the interface. In various embodiments, link management 280 may configure PHY 250a using an operational interface defined by PHY firmware 252a. For example, link management 280 may configure PHY 250a using a port register interface defined by PHY firmware 252a. In various embodiments, link management 280 and/or PHY 250a may receive status information over the interface. In some embodiments, a communication process (or "handshaking" process) may be used to manage communication between link management 280 and PHY 250a (see FIGS. 5 and 6A-6D).

Figure 3:
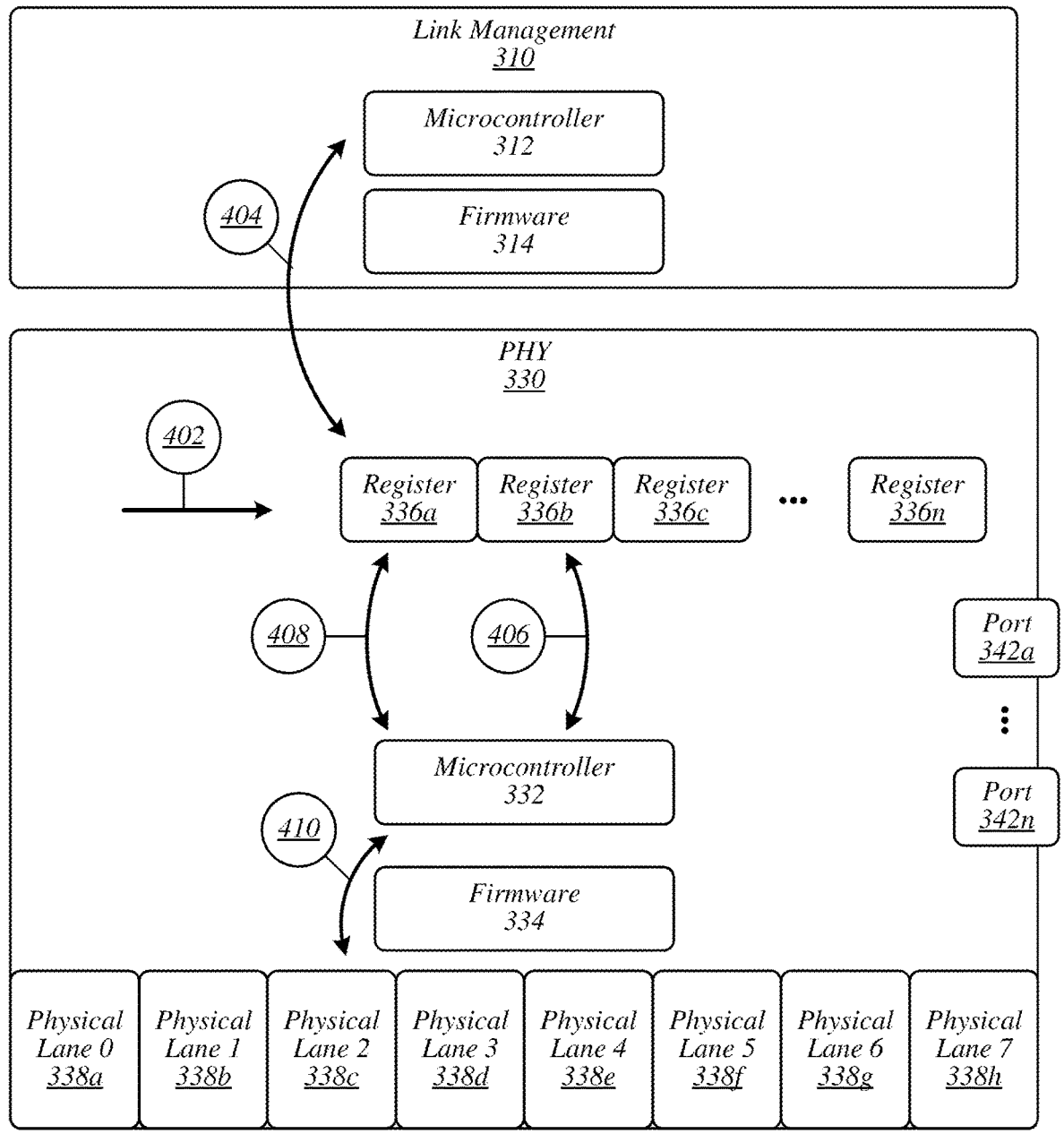
FIG. 3 illustrates an embodiment of a third operating environment.

FIG. 3 illustrates an example of an operating environment 300 that may be representative of various embodiments. The operating environment 300 depicted in FIG. 3 may include a link management 310 and PHY 330. Link management 310 may include microcontroller 312 to control operation of link management 310, for example, at least partially through execution of firmware 314. PHY 330 may include microcontroller 332 to control operation of PHY 330, for example, at least partially through execution of firmware 334. In some embodiments, PHY 330 may include registers 334a-n and physical lanes 0-7 338a-h. Although FIG. 3 depicts interactions between link management 310 and PHY 330, embodiments are no so limited, as any component capable of operating according to some embodiments is contemplated herein. In addition, embodiments are not limited to physical lanes 0-7 338a-h, as some embodiments may include more or less physical lanes.

In various embodiments, firmware 334 may assign at least a portion of registers 336a-n to operate as interface registers (for example, registers 334a-c). In some embodiments, interface registers 334a-c may operate as read and/or write exchange interface between link management 310 (for instance, via firmware 314) and PHY 330. In various embodiments, interface registers 334a-c may operate as PHY 330 configuration and/or status registers. In some embodiments, interface registers 334a-c may be accessible for read, write, or read and write by one or both of link management 310 and PHY 330. In some embodiments, the interface registers 334a-c may not configure PHY hardware, such as ports or physical lanes 338a-h, directly, for instance, to provide a level of abstraction between link management 310 and PHY 330. In this manner, firmware 334 may operate to manage PHY 330 hardware (for instance, based on interface information in interface registers 334a-c) and link management 310 to operate independently.

Interface registers may be configured for communication between link management 310 and ports 342a-n. In some embodiments, interface registers 336a-n may be assigned read and/or write permission by firmware 314 and/or firmware 334. Firmware 334 may include port management software, algorithms, processes, modules, and/or the like for managing ports 342a-n. In various embodiments, firmware, such as a port manager of firmware 334, and firmware 314 may have read permission for all of interface registers 336a-n. In some embodiments, certain of interface registers (such as interface register 336c) may be link management registers that may only be written by firmware 314. In some embodiments, link management register 336c may be used by firmware 314 to pass information to one or more of ports 342a-n. In various embodiments, certain of interface registers (such as interface register 336b) may be component registers (such as port registers) that may only be written by firmware 334, such as via a port manager module of firmware 334. In some embodiments, component registers may be writable by firmware 314 (alone or in addition to firmware 334). In some embodiments, port register 336b may operate to provide information to link management 310 via firmware 314 regarding one or more ports 342a-n. In various embodiments, port register 336b may only be written by firmware 334, such as via a port manager module of firmware 334.

Included herein are one or more logic flows representative of exemplary methodologies for performing novel aspects of the disclosed architecture. While, for purposes of simplicity of explanation, the one or more methodologies shown herein are shown and described as a series of acts, those skilled in the art will understand and appreciate that the methodologies are not limited by the order of acts. Some acts may, in accordance therewith, occur in a different order and/or concurrently with other acts from that shown and described herein. For example, those skilled in the art will understand and appreciate that a methodology could alternatively be represented as a series of interrelated states or events, such as in a state diagram. Moreover, not all acts illustrated in a methodology may be required for a novel implementation.

A logic flow may be implemented in software, firmware, hardware, or any combination thereof. In software and firmware embodiments, a logic flow may be implemented by computer executable instructions stored on a non-transitory computer readable medium or machine readable medium, such as an optical, magnetic or semiconductor storage. The embodiments are not limited in this context.

Figure 4:
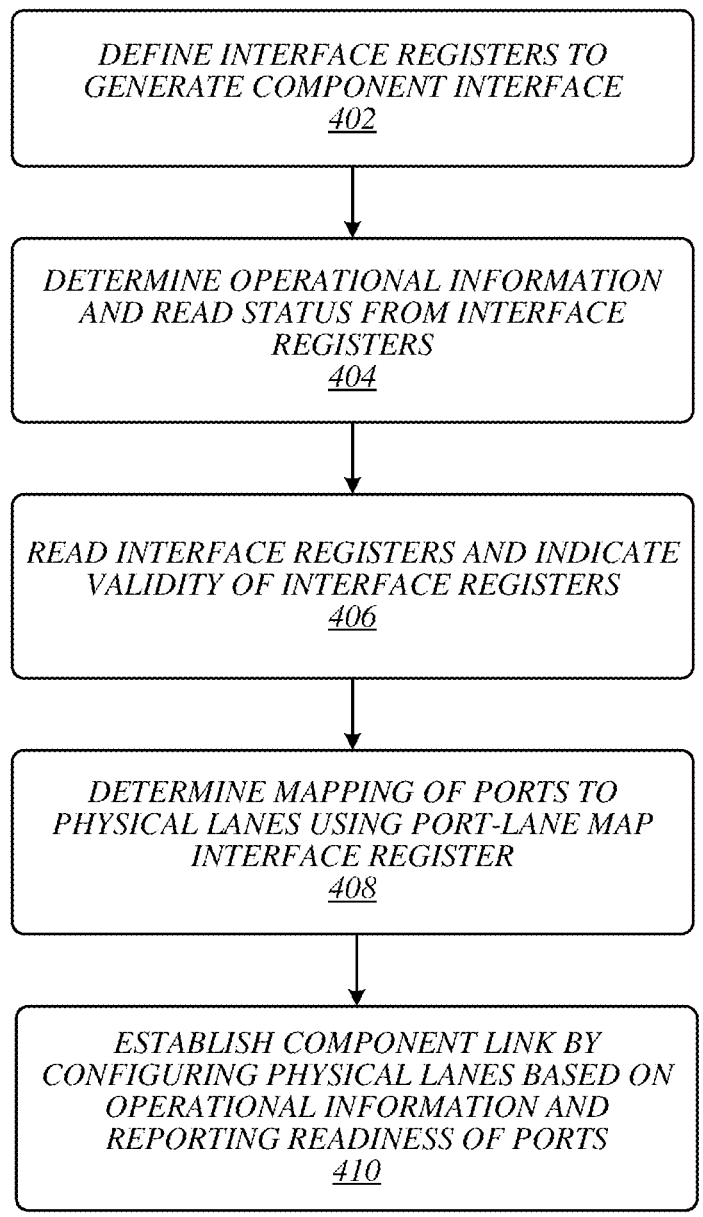
FIG. 4 illustrates an embodiment of a first logic flow.

FIG. 4 illustrates an embodiment of a logic flow 400. The logic flow 400 may be representative of some or all of the operations executed by one or more embodiments described herein, such as apparatus 105, 205, link management 310, and/or PHY 330. In some embodiments, logic flow 400 may be representative of some or all of the operations for establishing an interface between components and/or communicating over such an interface. Referring to FIG. 3, references 402-410 are to blocks of logic flow 400 illustrated in FIG. 4.

As shown in FIG. 4, logic flow 400 may define interface registers to generate a component interface at block 402. For example, firmware 334 may define interface registers 336a-c from registers 336a-n. In some embodiments, interface registers 336a-c may be defined by firmware 334, firmware 314, and/or a combination of firmware 334 and firmware 314. At block 404, logic flow may determine operational information and read a status from interface registers. For example, firmware 314 may configure operational information, such as mode, port capabilities, and/or the like of one or more ports 342a-n of PHY 330. In some embodiments, the status may include any type of status information associated with PHY 330 and/or components thereof, such as the status of registers 336a-n, ports 342a-n, physical lanes 338a-h, microcontroller 332, firmware 334, and/or the like.

Logic flow 400 may read interface registers and indicate a validity of interface registers at block 406. For example, PHY 330, through firmware 334, may read interface registers 336a-c as updated by firmware 314 in block 404. In some embodiments, firmware 334 may indicate whether the interface registers 336a-c are valid based on one or more criteria, such as the values of interface registers 336a-c being within a threshold value, having an expected value and/or form, including a validity indicator, and/or the like. At block 408, logic flow may determine a mapping of ports to physical lanes using a port-lane map interface register. For example, one of interface registers 336a-c, such as 336a, for example, may be defined as a port-lane map interface register. Firmware 334 may use interface information (for example, a value of a field of port-lane map interface register 336a) to determine a mapping of ports 342a-n to physical lanes 338a-h. At block 410, logic flow 400 may establish component link by configuring physical lanes based on operational information and may report readiness of ports. For example, firmware 334 may configure physical lanes 338a-h based on a requested configuration and/or a mode and may report a readiness of one or more of ports 342a-n to establish a link with link management 310.

Figure 5:
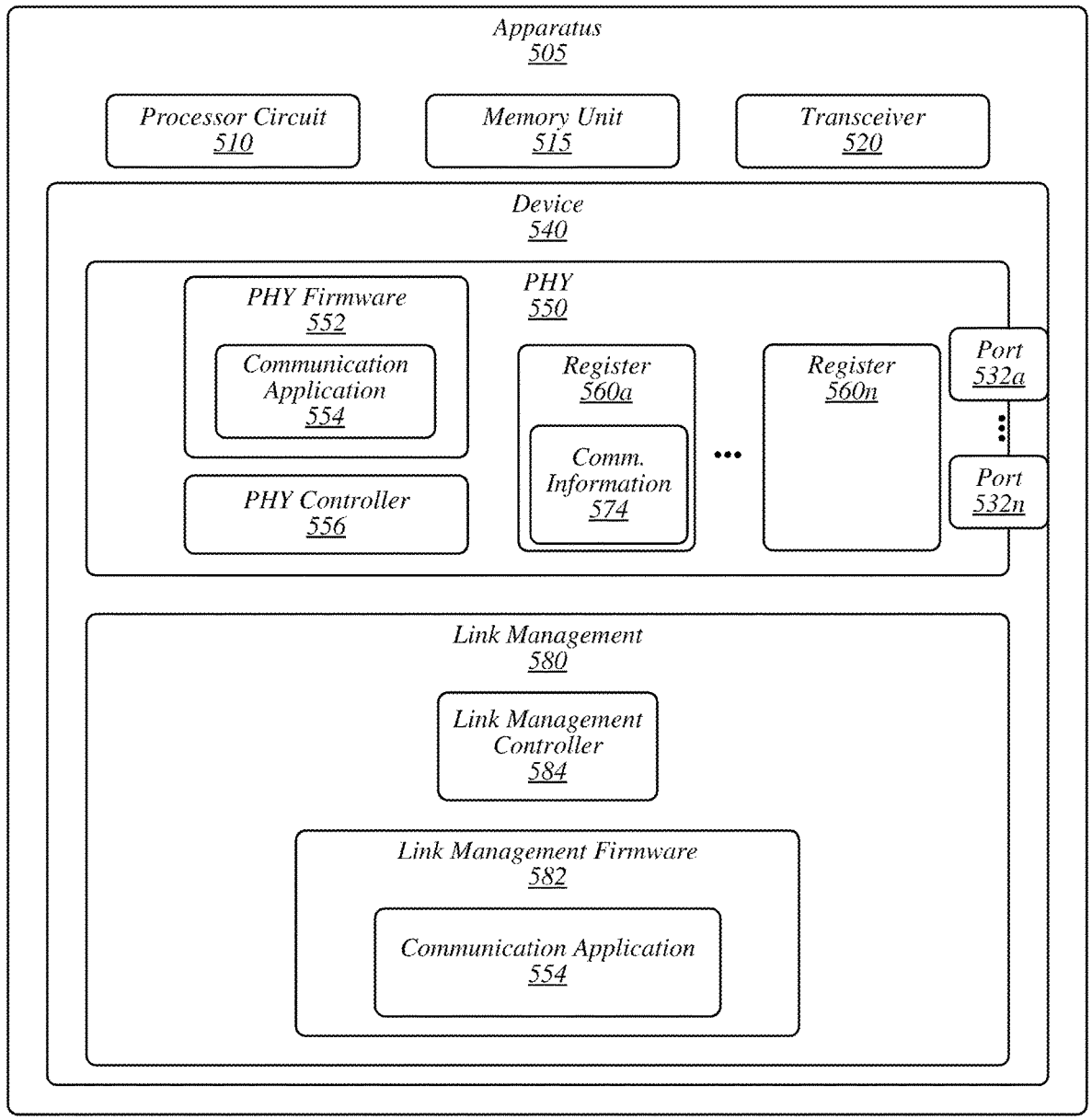
FIG. 5 illustrates an embodiment of a third operating environment.

FIG. 5 illustrates an example of an operating environment 500 that may be representative of various embodiments. The operating environment 500 depicted in FIG. 5 may include an apparatus 505 having a processor circuit 510, a memory unit 515, and a transceiver 520. Processor circuit 510 may include and or may access logic having instructions for performing operations according to some embodiments. Processor circuit 510 may be communicatively coupled to memory unit 515 and/or transceiver 520.

As shown in FIG. 5, apparatus 505 may include a device 540 having a PHY 550 component and a link management 580 component. Although FIG. 5 depicts PHY 550 and link management 580, embodiments are not so limited, as any type of component capable of operating according to some embodiments is contemplated herein. For example, any type of components that are independently controlled via a controller (or microcontroller) and firmware and which one component includes a plurality of registers may operate according to some embodiments.

Link management 580 may include a link management controller 584 operative to execute link management firmware 582 to operate link management 580. In some embodiments, link management firmware 582 may include a communication application 554 that may include software, processes, code, algorithms, and/or the like to manage a communication process (or "handshaking" process) with PHY 550.

PHY 550 may include a PHY controller 556 operative to execute PHY firmware 552 to operate PHY 550. In some embodiments, PHY firmware 552 may include a communication application 554 that may include software, processes, code, algorithms, and/or the like to manage a communication or handshaking process with link management 580. PHY 550 may include a plurality of registers 560a-n, for instance, hardware registers. Registers 560a-n may be operative to store bits, bytes, data, signals, or other information. In some embodiments, registers 560a-n may be operative to store, among other things, communication information 574. PHY 550 may be associated with ports 532a-n for communicating with other components, protocols, devices, and/or the like. In some embodiments, link management 580 and PHY 550 may be operative to interface via registers 560a-n. Communication information 574 may include register fields and/or signals (for instance, bits) be defined by PHY firmware 552 and/or link management firmware 582 for functions of the communication process. Non-limiting examples of functions of the communication process may include a request function (REQUEST), a reset function (RESET), an acknowledge function (ACKNOWLEDGE), an error function (ERROR), and/or the like.

In various embodiments, communication application 554 may operate to facilitate a communication or handshaking process between PHY 550 and link management 580. For instance, communication application 554 may ensure reliable communications between a component interface defined by firmware, such as the component interface depicted in FIGS. 2 and 3. In some embodiments, the communication process may include handshaking operations, timing requirements, and/or read/write partitioning of registers 560a-n to avoid collisions between PHY controller 556 and link management controller 584 operating across the component interface. In some embodiments, the communication process may include techniques for PHY controller 556 and link management controller 584 to read and/or write to registers 560a-n that are accessible to both PHY controller 556 and link management controller 584.

In some embodiments, a portion of registers 560a-n may be defined as handshaking registers for implementing the communication process according to some embodiments. For example, each of PHY controller 556 and link management controller 584 may be assigned individual permissions to read and/or write to specific handshaking registers. In various embodiments, PHY controller 556 and link management controller 584 may only be able to write to specific registers 560a-n, and PHY controller 556 and link management controller 584 may be able to read all registers defined for the component interface (for instance, handshaking registers). In some embodiments, none of registers 560a-n may be written by more than one of PHY controller 556 or link management controller 584. In some embodiments, communication application 554 may facilitate a separate handshaking process for communication between individual elements of PHY 550 and link management 580. For example, each of ports 532a-n may communicate with link management 580 using an individual handshaking process. Accordingly, in some embodiments, handshaking registers may include a set of handshaking registers associated with one or more specific ports 532a-n for managing the handshaking process for the corresponding port 532a-n.

Conventional systems relied on hardware-defined interfaces for providing communication between components, particularly components operated by independent controllers. Such hardware-defined interfaces required co-development and specified hardware interfaces between components. However, some embodiments provide for a communication process operable between two independently developed components. The communication process according to some embodiments may be bus rate independent, efficiently modeled for validation, and extensible and flexible as the communication process may be defined via software (for instance, firmware).

Figure 6A:
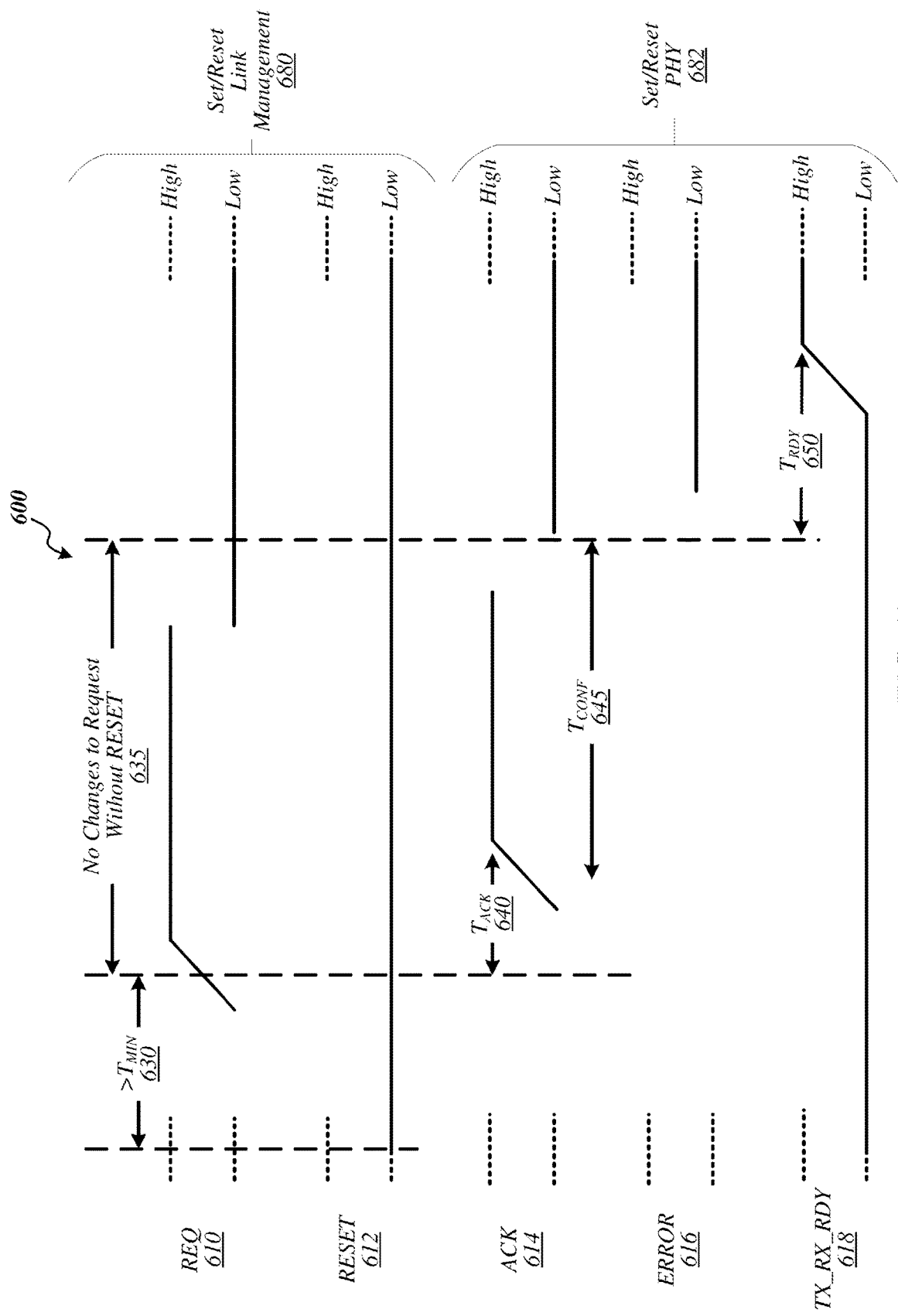
FIGS. 6A-6D illustrate embodiments of a communication process.

FIG. 6A depicts a timing diagram of a handshake process 600 between PHY controller 556 and link management controller 584 over a component interface. Handshake process 600 may include various fields or signals 610-618 that may be asserted (for instance, be set from "Low" to "High," "0" to "1," and/or the like) or de-asserted (for instance, be set from "High" to "Low," "1" to "0," and/or the like). Non-limiting examples of fields may include REQUEST (REQ) 610, RESET 612, ACKNOWLEDGE (ACK) 614, ERROR 616, and/or TRANSMIT (TX) or RECEIVE (RX) READY (TX_RX_READY) 618. In various embodiments, REQ 610 and RESET 612 may be used as part of a set/reset link management process 680. In some embodiments, ACK 614, ERROR 616, and TX_RX_READY 618 may be used as part of a set/reset PHY process 682. In various embodiments, fields 610-618 may be stored in registers 560a-n of PHY 550. In various embodiments, PHY 550 and link management 580 may be operative to read fields 610-618 in registers 560a-n and to write (for instance, assert or de-assert) certain of fields 610-618.

In various embodiments, handshake process 600 may be used for each port 532a-n of PHY 550. As shown in FIG. 6A, TAC K 640 may include the time allotted for a port 532a-n to acknowledge a REQ 610 assertion. $T_{CONF}$ 645 may include a time for a port 532a-n to complete a request. For example, $T_{CONF}$ 645 may include an amount of time during which a port 532a-n may be configured for a particular mode by PHY firmware 552. In some embodiments, no updates to interface registers may be made by link management 580 between the assertion of REQ 610 and de-assertion of ACK 614, as indicated in FIG. 6A by reference "no changes to request without reset" 635. During the time between the de-assertion of ACK 614 and the assertion of TX_RX_READY 618, ERROR 616, and/or $T_{RDY}$ 650, one of ports 532a-n may be attempting to establish a link if a partner is present. ERROR 616 may be asserted during this time if an invalid request is made to port 532a-n through the component interface. In some embodiments, $T_{RDY}$ 650 may include a minimum time required by PHY 550 or port 532a-n to establish a link (a minimum link time), assuming, for example, that a link partner is present and conditions are met for the specified mode.

In various embodiments, $T_{MIN}$ 630 (a minimum assertion time) may be asserted by port 532a-n and may include a value greater than the minimum of one of: an assertion time required for RESET 612, a time required between the de-assertion of REQ 610 and the assertion of RESET 612, or a time required between the de-assertion of RESET 612 and the assertion of REQ 610 required by one of ports 532a-n. In some embodiments, RESET 612 may be asserted until a subsequent assertion of REQ 610. In various embodiments, violation of $T_{ACK}$ 640 and/or $T_{CONF}$ 645 may trigger a reset process (see FIGS. 6B and 6C).

Figure 6B:
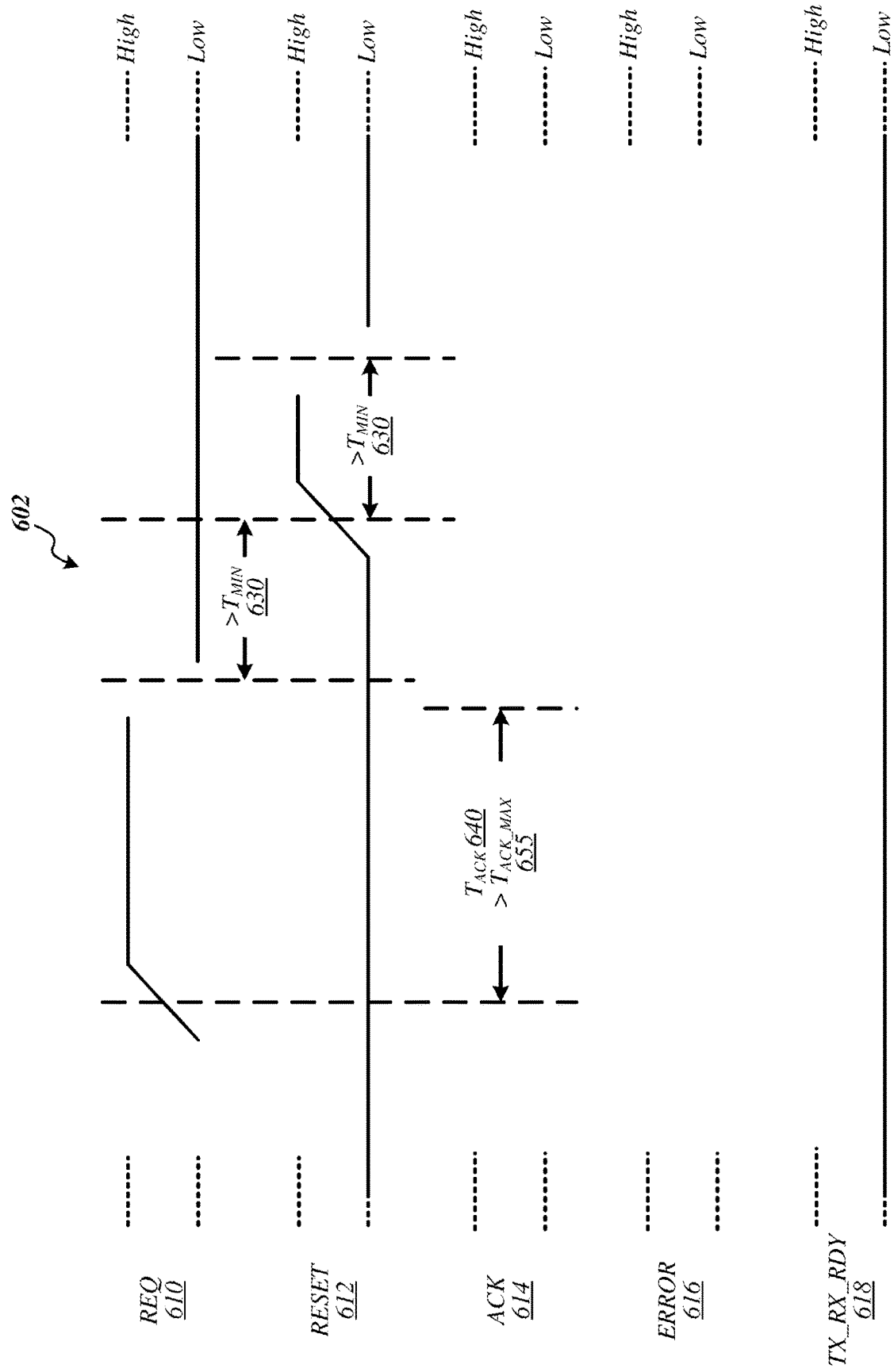
Figure 6C:
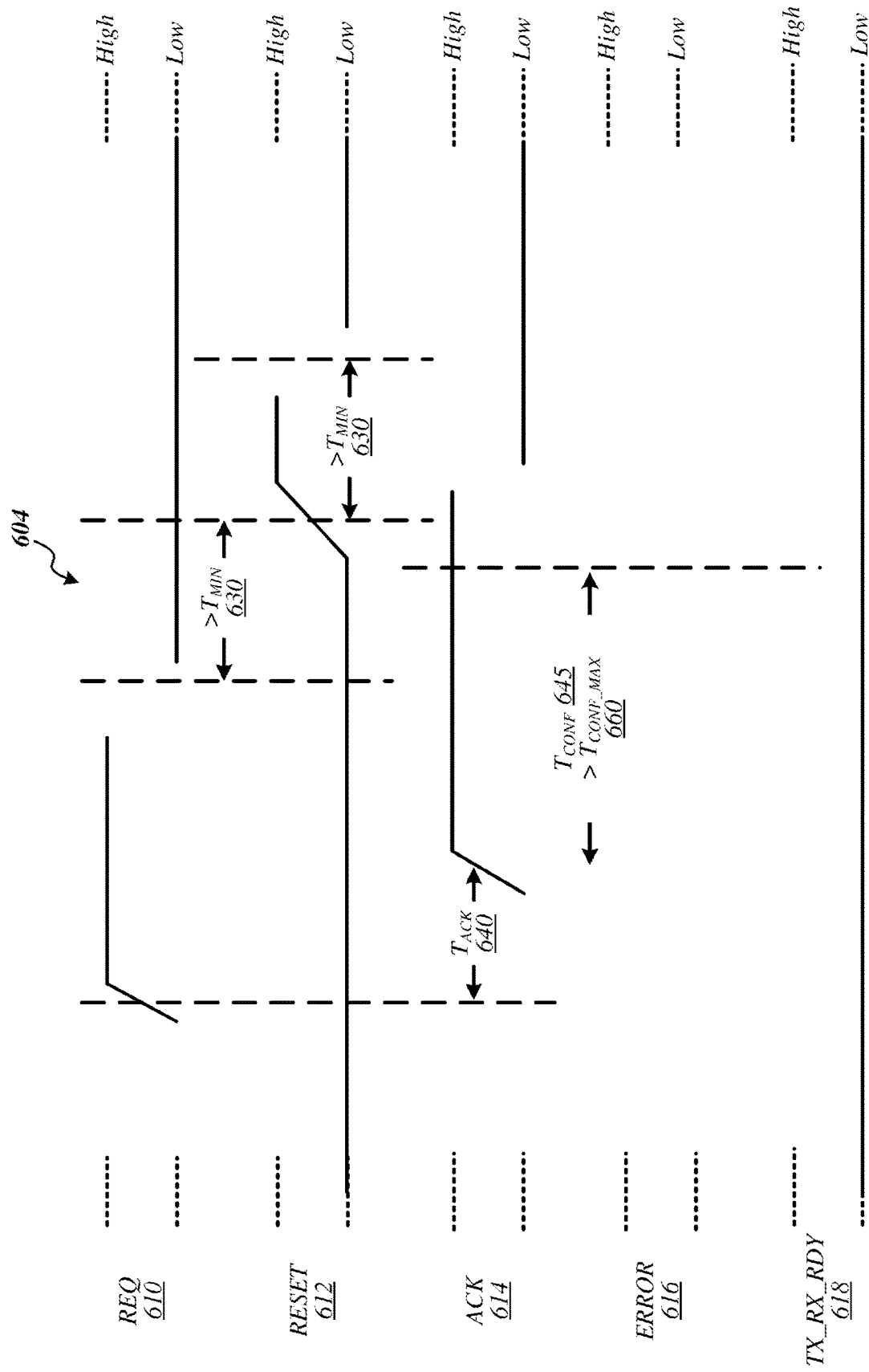
Figure 6D:
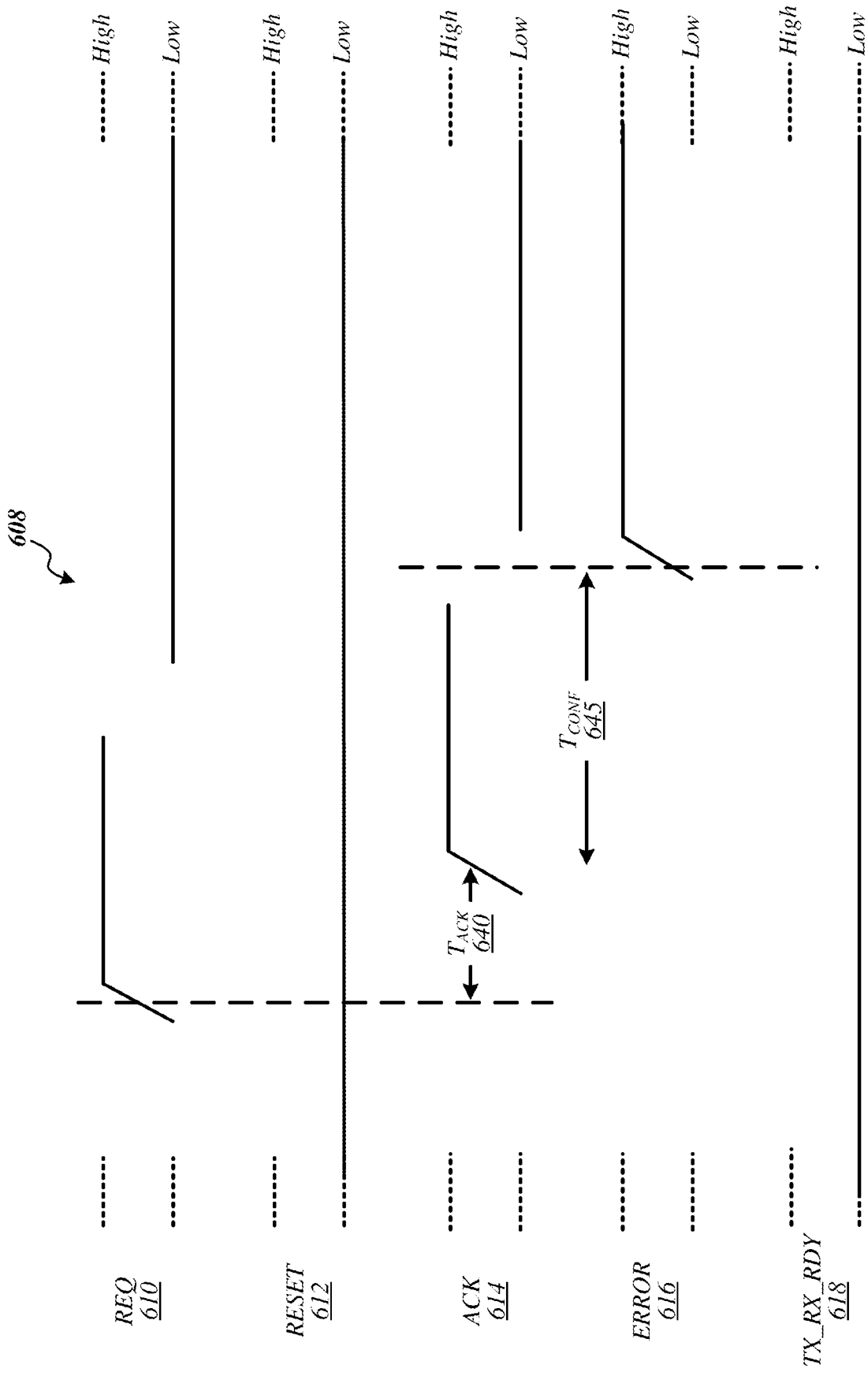

FIG. 6B depicts a timing diagram of a communication process 602 between PHY controller 556 and link management controller 584 over a component interface. In some embodiments, communication process 602 may include a component interface reset process. In various embodiments, communication process 602 may be triggered responsive to $T_{ACK}$ 640>$T_{ACK\_MAX}$ 655. In various embodiments, $T_{ACK\_MAX}$ 655 may be specified by port 532a-n. In some embodiments, $T_{ACK\_MAX}$ 655 may include a maximum time required by port 532a-n to set ACK 614 after an assertion of REQ 610 (a maximum acknowledgment time). In various embodiments, $T_{ACK\_MAX}$ 655 may depend on a number of concurrent REQs 610 allowed by PHY 550, for example, if PHY controller 556 is shared across ports 532a-n. FIG. 6C depicts a timing diagram of a communication process 604 between PHY controller 556 and link management controller 584 over a component interface. In some embodiments, communication process 604 may include a component interface reset process. In various embodiments, communication process 604 may be triggered responsive to $T_{CONF}$ 645>$T_{CONF\_MAX}$ 660. In some embodiments, $T_{CONF\_MAX}$ 660 may be specified by port 532a-n. In some embodiments, $T_{CONF\_MAX}$ 660 may include a maximum time required by PHY 550 or port 532a-n to configure a requested mode (a maximum configuration time). FIG. 6D depicts a timing diagram of a communication process 608 between PHY controller 556 and link management controller 584 over a component interface. In some embodiments, communication process 608 may be operative to communicate an error on the component interface. For instance, if one of ports 532a-n is unable to complete a request, the port 532a-n may communicate an error to link manager 580, for instance, by asserting ERROR 616. In various embodiments, an error may occur if a requested configuration of one of ports 532a-n is invalid or incompatible with adjacent ports 532a-n.

In some embodiments, different PHY 550 and/or different ports 532a-n may include different implementations and/or capabilities that may affect the particular timing of communication processes 602-608 depicted in FIGS. 6A-6D. Accordingly, PHY 550 and/or ports 532a-n may provide required timing information to link manager 580 so that link manager 580 may adhere to port configuration requirements. Non-limiting examples of such timing requirements may include $T_{MIN}$ 630, $T_{CONF\_MAX}$ 660, $T_{RDY}$ 650, and/or $T_{ACK\_MAX}$ 655.

Figure 7:
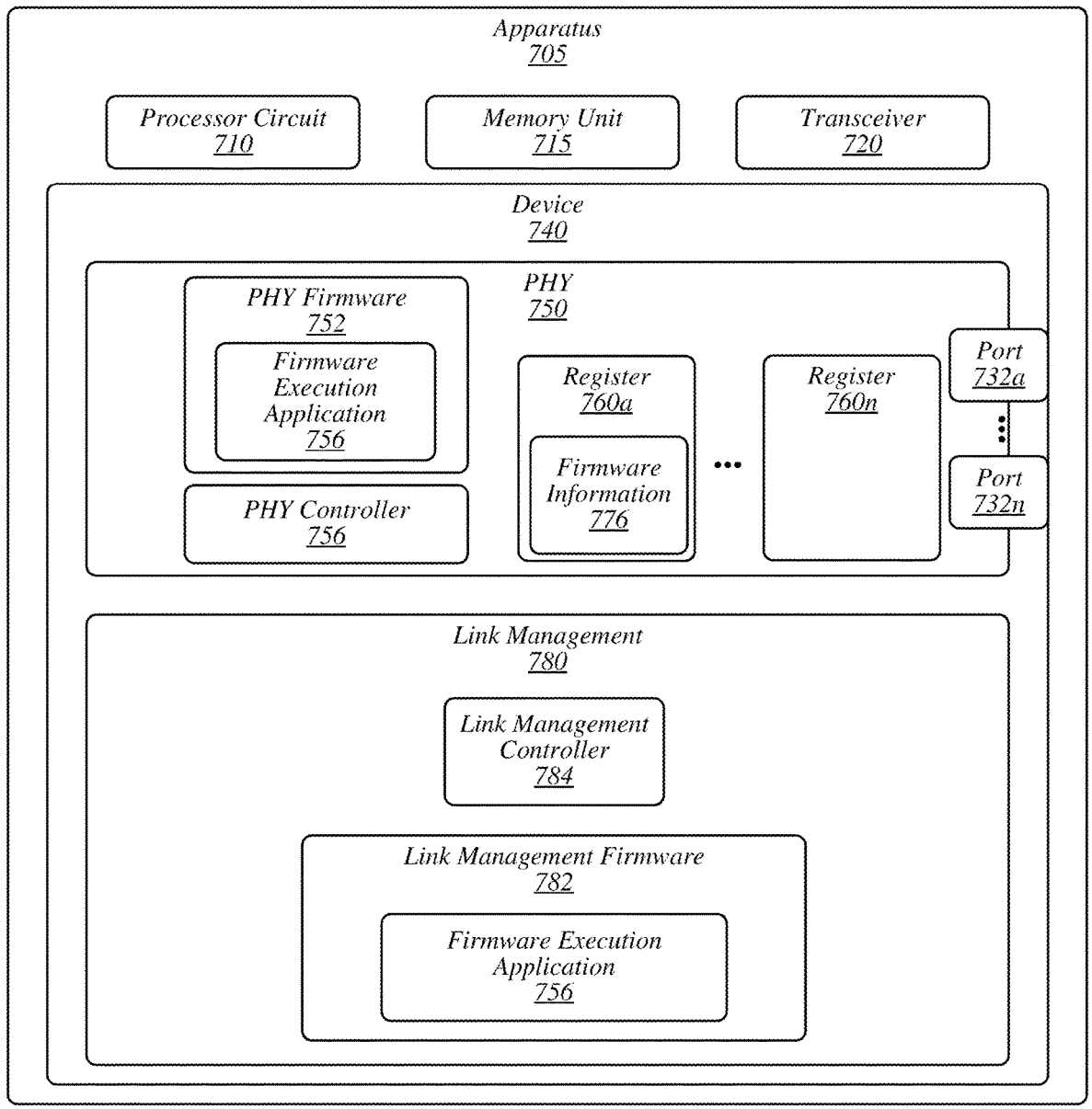
FIG. 7 illustrates an embodiment of a fifth operating environment.

FIG. 7 illustrates an example of an operating environment 700 that may be representative of various embodiments. The operating environment 700 depicted in FIG. 7 may include an apparatus 705 having a processor circuit 710, a memory unit 715, and a transceiver 720. Processor circuit 710 may include and or may access logic having instructions for performing operations according to some embodiments. Processor circuit 710 may be communicatively coupled to memory unit 715 and/or transceiver 720.

As shown in FIG. 7, apparatus 705 may include a device 740 having a PHY 750 component and a link management 780 component. Although FIG. 7 depicts PHY 750 and link management 780, embodiments are not so limited, as any type of component capable of operating according to some embodiments is contemplated herein. For example, any type of components that are independently controlled via a controller (or microcontroller) and firmware and which one component includes a plurality of registers may operate according to some embodiments.

Link management 780 may include a link management controller 784 operative to execute link management firmware 782 to operate link management 780. In some embodiments, link management firmware 782 may include a firmware execution application 754 that may include software, processes, code, algorithms, and/or the like to track or otherwise monitor execution of link management firmware 782 and/or PHY firmware 752.

PHY 750 may include a PHY controller 756 operative to execute PHY firmware 752 to operate PHY 750. In some embodiments, PHY firmware 752 may include a firmware execution application 754 that may include software, processes, code, algorithms, and/or the like to track or otherwise monitor execution of link management firmware 782 and/or PHY firmware 752. PHY 550 may include a plurality of registers 760a-n, for instance, hardware registers. Registers 760a-n may be operative to store bits, bytes, data, signals, or other information. In some embodiments, registers 760a-n may be operative to store, among other things, firmware information 776. PHY 750 may be associated with ports 732a-n for communicating with other components, protocols, devices, and/or the like. In some embodiments, link management 780 and PHY 750 may be operative to interface via registers 760a-n. Firmware information 776 may include information associated with execution of link management firmware 782 and/or PHY firmware 752. Non-limiting examples of firmware information 776 may include execution steps, pointers, execution logs, and/or the like.

In some embodiments, firmware execution application 756 may provide an autonomous logging mechanism for a firmware-controlled hardware device, such as PHY 750 and/or link management 780. Conventional firmware-controlled and hardware-based systems logged events to certain memory units, such as RAM, and required an external debugger or similar access interface to read RAM and download an execution log. In addition, platforms for conventional systems (for instance, a working production system at a customer site) do not include debug hardware access ports necessary to read the memory unit (for instance, RAM) contents. Furthermore, controller (or microcontroller) RAM is not generally accessible, for example, to system bus fabrics and therefore requires a special hardware debug tool interface to read externally. Such hardware debug tools must also meet certain requirements, such as security requirement.

Accordingly, an execution tracking process performed via firmware execution application 756 removes the need for use of a memory unit, such as RAM, and an external debugging application to provide access to a historical log of firmware execution. In addition, execution tracking techniques provided according to some embodiments may use existing hardware registers (for instance, registers 760a-n) to store an execution log (for instance, an abbreviated execution log) that may be accessed by any application capable of configuring the execution log function. In this manner, execution logs generated according to some embodiments may be accessible to firmware (for instance, link management firmware 782 and/or PHY firmware 752) and/or software drivers without requiring additional hardware interfaces for access. In addition, execution logs generated according to some embodiments may be read as part of a validation process using externally controlled test environments.

For example, in a Python validation flow for Ethernet PHYs, the firmware may be controlling the interface and logging its execution to registers (such as registers 760a-n). Because the execution log is stored in hardware registers which the Python validation flow may read as part of a validation test, the execution log may be checked for correct sequencing and/or the like. Another example may involve an on-site system debug in a data center system. Conventional volume production system boards do not implement hardware interfaces needed to access controller (or microcontroller) execution and RAM. Accordingly, the ability to read an execution log generated according to some embodiments using a software driver or other application may provide a process for accessing the execution log of component firmware.

In some embodiments, link management firmware 782 and/or PHY firmware 752, via corresponding firmware execution application 756 may operate to write firmware information 776 in the form of execution indices representing each firmware state. Firmware execution application 756 may write the execution indices to registers 760a-n as link management firmware 782 and/or PHY firmware 752 progresses through their respective states. In various embodiments, at least a portion of registers 760a-n may be defined as monitor registers used to monitor the execution of link management firmware 782 and/or PHY firmware 752. In some embodiments, the firmware information 776 indices may be nibbles (or larger) of firmware information 776 written to registers 760a-n. In some embodiments, the execution tracking process may be enabled and/or disabled by link management firmware 782 and/or PHY firmware 752. In various embodiments, each of link management firmware 782 and PHY firmware 752 may have an individual execution tracking process. For instance, firmware execution application 756 of PHY firmware 752 may use certain of registers 760a-n in a PHY execution tracking process. In another instance, firmware execution application 756 of link management firmware 782 may use certain of registers 760a-n in a link management execution tracking process. Although certain examples may refer to an execution tracking process, such an execution tracking process may refer to an individual PHY execution tracking process or an individual link management execution tracking process.

In various embodiments, firmware execution application 756 may store the firmware execution sequence in registers 760a-n, for example, for access during application debugging, monitoring, and/or the like. In some embodiments, a pointer may keep track of the last state logged. For example, the pointer may keep track of the last state logged to identify the end of a sequence. In some embodiments, firmware execution application 756 may log continuously and, for instance, wrap when full as necessary. In some embodiments, firmware execution application 756 may log a specified number of states (for instance, a first N states) executed and stop. In such embodiments, N sates may be determined based on one or more factors including, without limitation, the number of registers 760a-n allotted for storage of the execution log, the size of the index used to represent the execution states, and/or the like. In various embodiments, the execution log may be cleared by clearing the corresponding registers 760a-n, such as by writing a zero to the corresponding registers 760a-n. In some embodiments, an enable/disable register bit may be used to enable/disable the execution tracking process.

In various embodiments, each execution state to be included in the execution log may be assigned an index. In some embodiments, all execution states may be indexed. In some embodiments, less than all execution states may be indexed. For example, a particular execution state may be selected to not be tracked if there is only one possible destination from the particular execution state, because logging the destination also indicates that the particular state was executed. In some embodiments, if an execution state is repeated, the execution state may be logged multiple times and/or a counter may be stored in the execution log to indicate a number of executions of the execution state.

In various embodiments, the execution log may include an array of execution elements. For example, execution log may include an array of log registers or records (for instance, an array of log register nibbles). Each time that an execution state is entered, firmware execution application 756 may increment the pointer to the next element (or nibble) in the array. The firmware execution application 756 may then write the index to the location indicated by the pointer.

The following Table 1 provides an execution tracking log configuration according to some embodiments:

TABLE 1

| Field | Init. | Description |
|---|---|---|
| 31 | 1 | Firmware tracking mode;<br>0 - wrap the execution log; save the last 30 states sequence;<br>1 - log until full; save the first 30 states only. |
| 30:29 | 0 | RESERVED |
| 28:24 | 00000 | Last FW state pointer;<br>Indicates the nibble containing the last FW state logged; FW state 0:29. |
| 23:20 | 0000 | FW state location 5 |
| 19:16 | 0000 | FW state location 4 |
| 15:12 | 0000 | FW state location 3 |
| 11:8 | 0000 | FW state location 2 |

TABLE 1-continued

| Field | Init. | Description |
|---|---|---|
| 7:4 | 0000 | FW state location 1 |
| 3:0 | 0000 | FW state location 0 |

As shown in Table 1, one of registers 760*a-n* (such as a monitor register) may include a pointer location field and control bits for selecting to wrap monitoring or to stop when full. Remaining space in a monitor register may be divided into various increments, such as nibbles, to store firmware information (such as firmware indices). In Table 1, a nibble may be used to store 16 indices.

The following Table 2 provides a firmware log register map according to some embodiments:

TABLE 2

| | | | | Firmware Log Storage | | | | |
|---|---|---|---|---|---|---|---|---|
| Nibble | 31:28 | 28:24 | 23:20 | 19:16 | 15:12 | 11:8 | 7:4 | 3:0 |
| Reg 0 | control | and pointer | Loc. 5 | Loc. 4 | Loc. 3 | Loc. 2 | Loc. 1 | Loc. 0 |
| Reg 1 | Loc. 13 | Loc. 12 | Loc. 11 | Loc. 10 | Loc. 9 | Loc. 8 | Loc. 7 | Loc. 6 |
| Reg 2 | Loc. 21 | Loc. 20 | Loc. 19 | Loc. 18 | Loc. 17 | Loc. 16 | Loc. 15 | Loc. 14 |
| Reg 3 | Loc. 29 | Loc. 28 | Loc. 27 | Loc. 26 | Loc. 25 | Loc. 24 | Loc. 23 | Loc. 22 |

FIG. 8 depicts an illustrative execution log configuration according to some embodiments. As shown in FIG. 8, an execution log 805 may include elements for logger indices 810, firmware (FW) states 815, and/or a pointer 820. In some embodiments, pointer 820 element may include a pointer 825 in one location pointing at an FW state 815.

Figure 9:
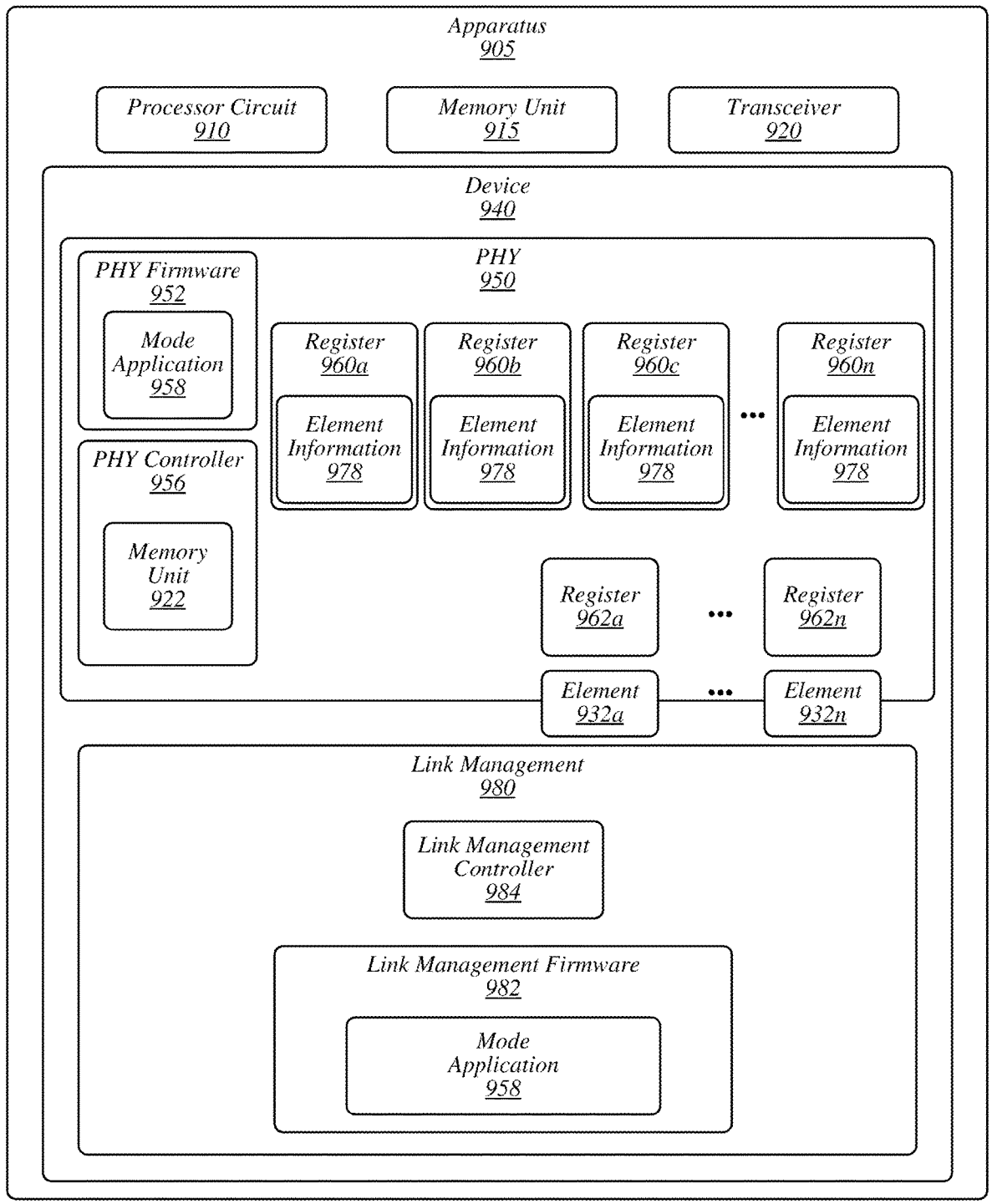
FIG. 9 illustrates an embodiment of a sixth operating environment.

FIG. 9 illustrates an example of an operating environment 900 that may be representative of various embodiments. The operating environment 900 depicted in FIG. 9 may include an apparatus 905 having a processor circuit 910, a memory unit 915, and a transceiver 920. Processor circuit 910 may include and or may access logic having instructions for performing operations according to some embodiments. Processor circuit 910 may be communicatively coupled to memory unit 915 and/or transceiver 920.

As shown in FIG. 9, apparatus 905 may include a device 940 having a PHY 950 component and a link management 980 component. Although FIG. 9 depicts PHY 950 and link management 980, embodiments are not so limited, as any type of component capable of operating according to some embodiments is contemplated herein. For example, any type of component that is independently controlled via a controller (or microcontroller) and firmware and which includes a plurality of registers and/or may access a memory unit may operate according to some embodiments.

Link management 980 may include a link management controller 984 operative to execute link management firmware 982 to operate link management 980. In some embodiments, link management firmware 982 may include a mode application 954 that may include software, processes, code, algorithms, and/or the like to manage mode selection and/or mode configuration with PHY 950. In some embodiments, PHY 950 may be communicatively coupled with link management 980.

PHY 950 may include elements 932*a-n* for performing various functions of PHY 950. In some embodiments, elements 932*a-n* may include ports for communicating with other components, protocols, devices, and/or the like. Although ports may be used as illustrative elements 932*a-n* in some examples, embodiments are not so limited, as any type of element capable of operating according to some embodiments is contemplated herein.

PHY 950 may include a PHY controller 956 operative to execute PHY firmware 952 to operate PHY 950. In various embodiments, PHY controller 956 may include a memory unit 922. In some embodiments, memory unit 922 may include a RAM memory unit, such as a memory-mapped RAM memory unit. In some embodiments, PHY firmware 952 may include a mode application 954 that may include software, processes, code, algorithms, images, binary files, and/or the like to manage assigning and/or configuration modes of ports 932*a-n*. In various embodiments, PHY firmware 952 may be formed from and/or may include multiple firmware images. For instance, PHY firmware 952 operative to control PHY 950 may result from converging multiple firmware images, binary files, NVMs, and/or the like. For instance, multiple total or partial firmware images, at least a portion of which may be configured to operate with different modes, may be converged to generate PHY firmware 952 that is capable of operating with multiple different modes for ports 932*a-n*.

PHY 950 may include a plurality of registers 960*a-n*, for instance, hardware registers. Registers 960*a-n* may be operative to store bits, bytes, data, signals, or other information. In some embodiments, registers 960*a-n* may be operative to store, among other things, element configuration information (or port information) 978. Non-limiting examples of element information 978 may include mode information, configuration information, and/or the like. In various embodiments, mode information may include information to specify a mode for one or more of ports 932*a-n*. Non-limiting examples of mode information may include port speed, port data rate, PMD type, connected media type, connected media length, and/or the like. A mode may include any type of port operation mode including, without limitation, 10GBASE (for instance, 10GBASE-T, 10GBASE-R, 10GBASE-KR, and/or the like), 40GBASE, 100GBASE, SFI, SGMII, and/or the like. Embodiments are not limited in this context. In some embodiments, one or more of registers 960*a-n* may be designated as a mode register operative to store mode information. Although examples include configuring ports 932*a-n*, embodiments are not so limited, as any element of a component capable of being configured according to some embodiments are contemplated herein.

In various embodiments, element information 978 may include configuration information for configuring, operating, or otherwise instructing ports 932*a-n* to operate according to a specified mode. For example, configuration information 978 may include information, parameters, functional information, tuning information (for instance, platform-specific tuning information), and/or the like for PHY firmware 952 and/or ports 932*a-n* to support a specified mode. In some embodiments, one or more of registers 960*a-n* may be designated as configuration registers operative to store configuration information. For example, register 960*a* may store mode information that specifies the mode for port 932*a*, and registers 960*b* and 960*c* may store configuration information used to configure port 932*a* to operate according to the specified mode.

In some embodiments, at least a portion of element information 978 may be included in PHY firmware 952, such as in program code and/or data of PHY firmware 952. Element information 978 included in program code and/or data of PHY firmware 952 may include element information 978 that is not likely to change, for instance, based on silicon performance characterization, platform specific dependencies, and/or the like. In some embodiments, at least a portion of element information 978 may be specified by link management 980, for instance, via mode application 958 of link management firmware 982. For example, link management 980 may operate to control or partially control modes of ports 932*a-n* by specifying port type information and/or configuration information of element information 978. In some embodiments, link management 980 may provide a specified mode for one or more of ports 932*a-n* by writing mode information to registers 960*a-n* (for instance, to a mode register) and PHY firmware 952 may operate to configure the one or more of ports 932*a-n* according to the specified mode.

In some embodiments, PHY 950 may include image register space (for instance, NVM register space). In various embodiments, image register space may be included within registers 960*a-c*. In some embodiments, image register space may be included in memory unit 922 and/or a separate set of registers 962*a-n*. In some embodiments, certain element information 978 (for instance, mode parameters) may be stored in image register space, for instance, because such element information 978 may change over time based on the performance, requirements, and/or specifics of a component, port, and/or the like. In various embodiments, storing certain element information 978 in image register space, and not in PHY firmware 952 and/or a binary file, system specific parameters for the platform may be specified without modifying and/or recompiling PHY firmware 952 code. For example, only the image register space portion of an image (such as an NVM image) needs to be updated.

In some embodiments, PHY firmware 952, via mode application 958, may initiate a port reset event for one or more of ports 932*a-n*. For instance, a port reset event may operate to evaluate a requested or specified mode for port 932*a*. In various embodiments, a mode may be read from a mode register, which may include one of registers 960*a-n* and/or memory unit 922 (such as a memory-mapped location of memory unit 922). For example, register 960*a* may be a mode register that stores mode information indicating a mode for port 932*a*.

One of ports 932*a-n* may be configured or programmed with an invalid mode type and/or invalid configuration because ports 932*a-n* may operate using multiple types of modes. Accordingly, in some embodiments, PHY firmware 952 may validate a specified mode type through a mode validation process. For example, the specified mode may be analyzed to determine whether the specified mode is valid or invalid. PHY firmware 952 may not configure ports 932*a-n* to the specified mode if the specified mode is determined to be invalid. If the specified mode is determined to be valid, PHY firmware 952 may determine whether the specified mode is compatible with, for instance, PHY 950, resources, adjacent ports, and/or any ports sharing resources with a port associated with the specified mode. In some embodiments, the mode validation process may operate to, among other things, ensure that any shared resources may support the combination of different modes across ports 932*a-n*. For example, the specified mode for port 932*a* may be 10GBASE, while the specified mode for port 932*n* may be SFI. The mode validation process may verify that PHY 950 resources and ports 932*a-n* may support such a combination of modes.

Each of ports 932*a-n* may operate according to a mode, which may be a default mode specified during system setup or may be a mode previously specified and/or configured by PHY firmware 952. In some embodiments, ports 932*a-n* may be operating in a base configuration which may include an initial port configuration and/or default initial operating mode configured to provide a baseline configuration over which other modes are configured.

In some embodiments, using port 932*a* as an example, responsive to determining that the specified mode for port 932*a* is valid and compatible (for instance, the specified mode passed the mode validation process), PHY firmware 952 may configure port 932*a* in the base configuration. In general, port 932*a* may be configured in the base configuration prior to configuring port 932*a* to the specified mode to, among other things, ensure that repeated mode changes may result in the same specific configuration for each mode. For example, without configuring ports 932*a-n* to a base configuration between changes to a mode, there is a possibility that one or more prior mode configurations may affect the configuration of a current specified mode. More specifically, the base configuration returns ports 932*a-n* to a known configuration after each specified mode. In some embodiments, the base configuration parameters for any settings that ports 932*a-n* need to enter the base configuration may be read from registers 960*a-n*, memory, and/or other locations that are loaded at initial power-up, boot-up, and/or the like. In various embodiments, element information 978 may include base configuration information for configuring ports 932*a-n* into the base configuration.

PHY firmware 952 may determine the configuration information required to program port 932*a* to operate according to the specified mode. For instance, PHY firmware 952 may determine which changes to the base configuration of port 932*a* may be required to program port 932*a* to operate according to the specified mode. For example, mode-specific changes required in addition to the base configuration may be read from configuration information of configuration registers of registers 960*a-n*. The mode-specific changes may include the specific mode-dependent "deltas" to the base configuration. Non-limiting examples of configuration information may include transmit equalization levels and settings, receiver equalization settings (including, for instance, initial conditions), and/or the like. In some embodiments, certain registers may be used to store the configuration information used by port 932*a* to operate according to the specified mode (for example, operating registers), including certain of registers 960*a-n* and/or a separate set of registers 962*a-n*.

Once the configuration information has been loaded into the appropriate registers for use by port 932*a* to operate according to the specified mode, port 932*a* may proceed through post-configuration processes. Non-limiting examples of post-configuration processes may include calibration, link discovery and establishment, and/or the like.

Figure 10:
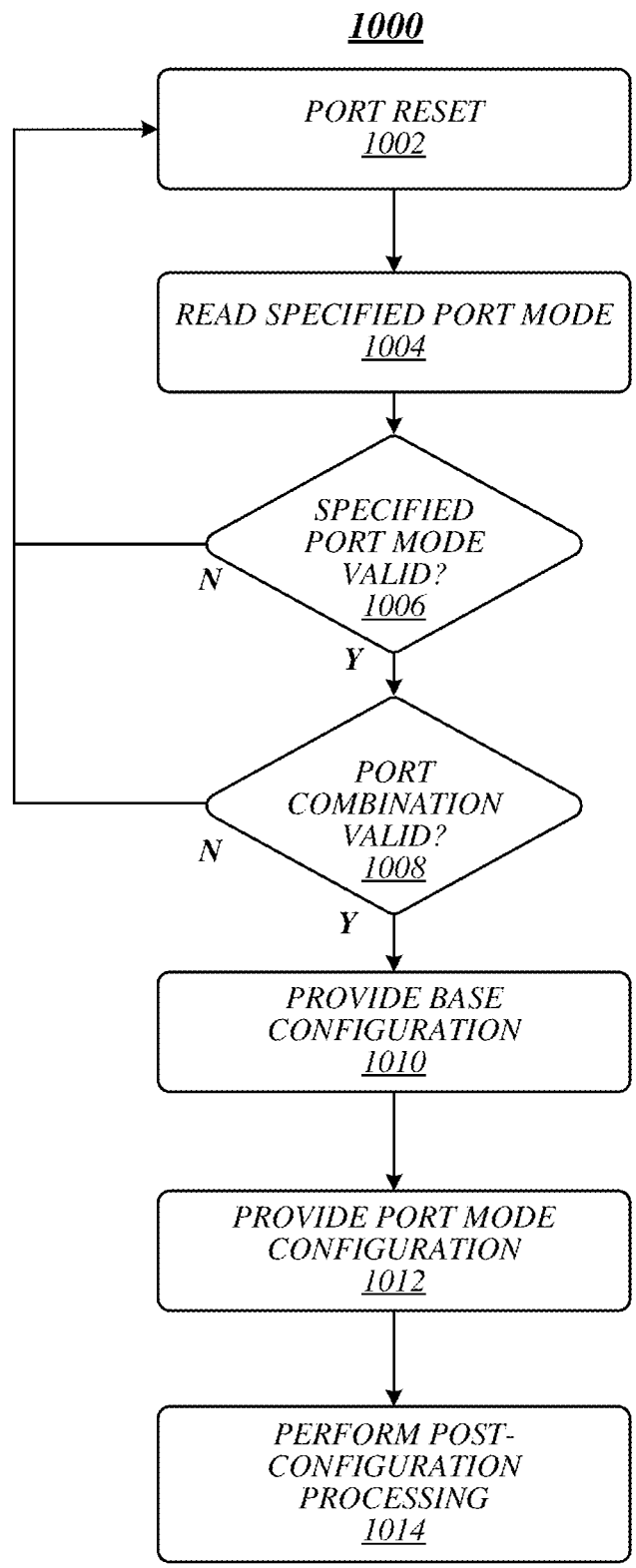
FIG. 10 illustrates an embodiment of a second logic flow.

FIG. 10 illustrates an embodiment of a logic flow 1000. The logic flow 1000 may be representative of some or all of the operations executed by one or more embodiments described herein, such as apparatus 105 and/or 905. In some embodiments, logic flow 1000 may be representative of some or all of the operations for configuring a port to operate according to a specified mode.

As shown in FIG. 10, logic flow 1000 may initiate a port reset at block 1002. For example, PHY firmware 952, via mode application 958, may initiate a port reset event for one or more of ports 932a-n. For instance, a port reset event may operate to evaluate a requested or specified mode for port 932a. The port reset event may be triggered by various factors. For instance, PHY firmware 952 may monitor a mode register to determine whether a change in mode information has occurred. A port reset at block 1002 may be triggered responsive to an instruction and/or detection of a change in mode information. Embodiments are not limited in this context.

At block 1004, logic flow 1000 may read the specified mode. For example, PHY firmware 952 may read the specified mode from a mode register. In some embodiments, the specified mode may be determined based on one or more values of a parameter used to specify the mode (for instance, a value of "001"=10GBASE-T, "010"=100GBASE-T, and/or the like). In some embodiments, the mode register may include a hardware register (such as registers 960a-n) and/or a location in a memory unit (such as a memory-mapped location of memory unit 922 operating as RAM). In various embodiments, the mode may indicate to PHY firmware desired port characteristics, such as port speed, data rate, PMD type, connected media type, connected media length, and/or the like.

Logic flow 1000 may determine whether the specified mode is valid at decision block 1006. Using port 932a as an example, PHY firmware 952 may determine whether port 932a may operate according to the specified mode. For instance, each of ports 932a-n may be associated with valid modes. The specified mode may be a 100GBASE mode; however, port 932a is only capable of operating at 10GBASE. Accordingly, PHY firmware 952 may check the valid modes for port 932a and determine that port 932a cannot operate according to the specified mode. If the specified mode is determined to be invalid, port 932a may operate using the current mode. In addition, if the mode is determined to be invalid, logic flow 1000 may return to block 1004 to read the specified mode again. In some embodiments, logic flow may repeat block 1004 to read the specified mode until the specified mode is valid. In various embodiments, certain controls may be implemented to ensure that resources are not overly burdened due to repeated reading of the specified mode at block 1004, such as a timer (or "wait") being included in the loop between decision block 1006 and block 1004.

If logic flow 1000 determines that the specified mode is valid at decision block 1006, logic flow 1000 may determine whether the port combination is valid at decision block 1008. For instance, PHY firmware 952 may determine whether the specified mode is compatible with, for instance, PHY 950, resources, adjacent ports, and/or any ports sharing resources with a port associated with the specified mode. In some embodiments, the mode validation process may operate to, among other things, ensure that any shared resources may support the combination of different modes across ports 932a-n. For example, the specified mode for port 932a may be 10GBASE, while the specified mode for port 932n may be SFI. The mode validation process may verify that PHY 950 resources and ports 932a-n may support such a combination of modes.

At block 1010, logic flow 1000 may provide a base configuration. Using port 932a as an example, responsive to determining that the specified mode for port 932a is valid and compatible, PHY firmware 952 may configure port 932a in the base configuration. In some embodiments, the base configuration returns ports 932a-n to a known configuration base or default configuration.

Logic flow 1000 may provide mode configuration at block 1012. Using port 932a as an example, PHY firmware 952 may determine the configuration information required to program port 932a to operate according to the specified mode. For instance, PHY firmware 952 may determine which changes to the base configuration of port 932a may be required to program port 932a to operate according to the specified mode. For example, mode-specific changes required in addition to the base configuration may be read from configuration information of configuration registers of registers 960a-n. PHY firmware 952 may program port 932a and/or provide configuration information for port 932a to operate according to the specified mode. For example, PHY firmware 952 may obtain the configuration information to modify the base configuration to be a configuration corresponding to the specified mode and may transfer this information to port hardware registers for use by port 932a to operate according to the specified mode.

At block 1014, logic flow 1000 may perform post-configuration processing. Using port 932a as an example, once the configuration information has been loaded into the appropriate registers for use by port 932a to operate according to the specified mode, port 932a may proceed through post-configuration processes. Non-limiting examples of post-configuration processes may include calibration, link discovery and establishment, and/or the like.

Figure 11:
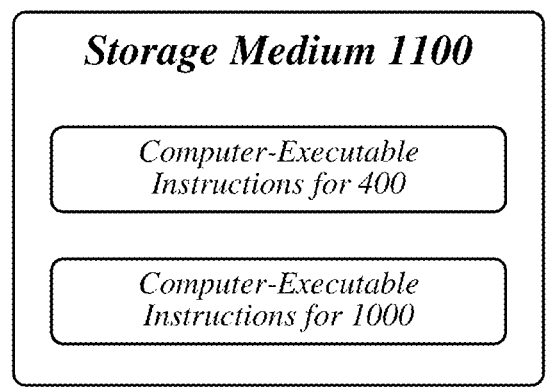
FIG. 11 illustrates an example of a storage medium.

FIG. 11 illustrates an example of a storage medium 1100. Storage medium 1100 may comprise an article of manufacture. In some examples, storage medium 1100 may include any non-transitory computer readable medium or machine readable medium, such as an optical, magnetic or semiconductor storage. Storage medium 1100 may store various types of computer executable instructions, such as instructions to implement logic flow 400 and/or logic flow 1000. Examples of a computer readable or machine readable storage medium may include any tangible media capable of storing electronic data, including volatile memory or non-volatile memory, removable or non-removable memory, erasable or non-erasable memory, writeable or re-writeable memory, and so forth. Examples of computer executable instructions may include any suitable type of code, such as source code, compiled code, interpreted code, executable code, static code, dynamic code, object-oriented code, visual code, and the like. The examples are not limited in this context.

Figure 12:
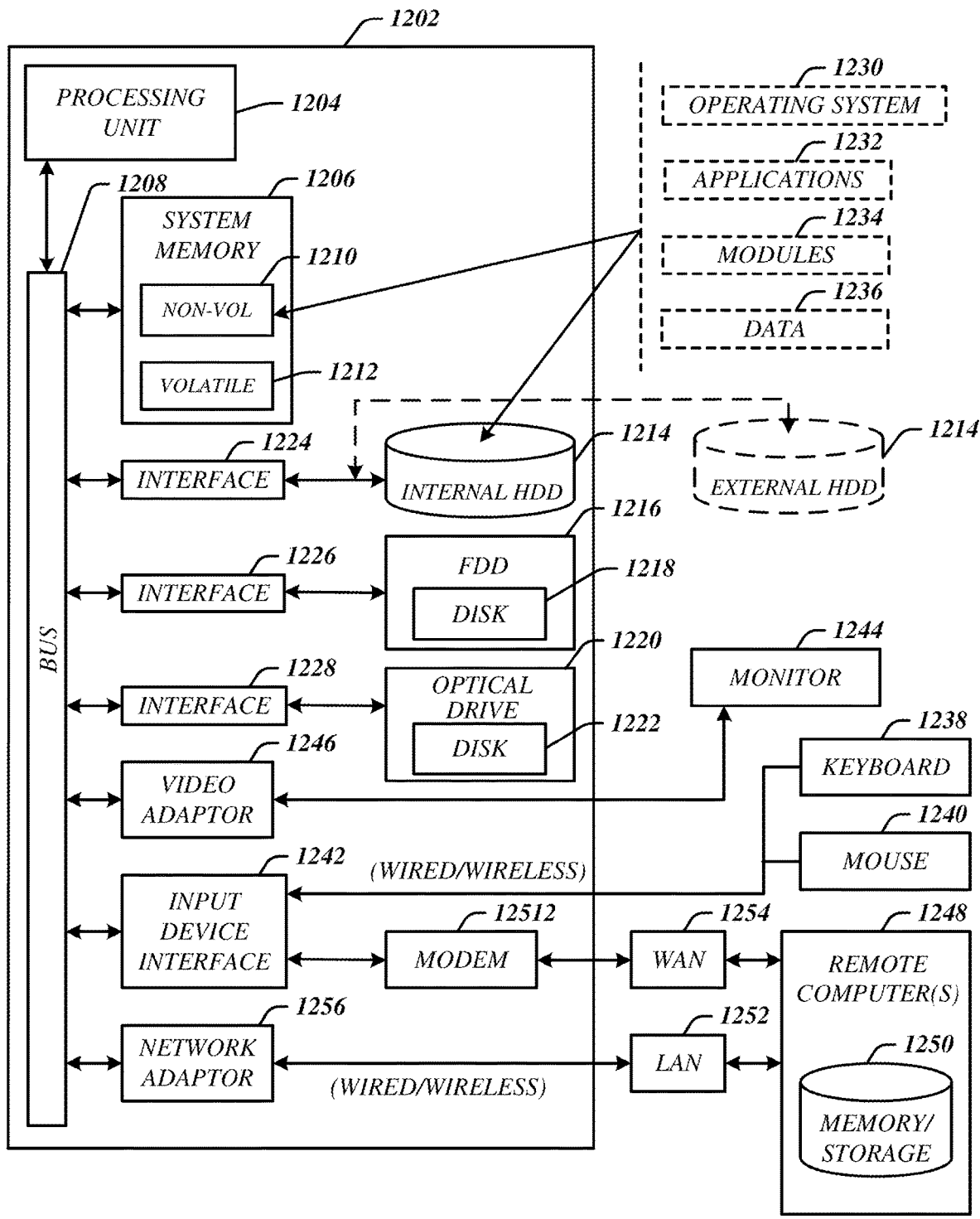
FIG. 12 illustrates an embodiment of a computing architecture.

FIG. 12 illustrates an embodiment of an exemplary computing architecture 1200 suitable for implementing various embodiments as previously described. In various embodiments, the computing architecture 1200 may comprise or be implemented as part of an electronic device. In some embodiments, the computing architecture 1200 may be representative, for example, of apparatus 105, 205, 505, 705, and/or 905. The embodiments are not limited in this context.

As used in this application, the terms "system" and "component" and "module" are intended to refer to a computer-related entity, either hardware, a combination of hardware and software, software, or software in execution, examples of which are provided by the exemplary computing architecture 1200. For example, a component can be, but is not limited to being, a process running on a processor, a processor, a hard disk drive, multiple storage drives (of optical and/or magnetic storage medium), an object, an executable, a thread of execution, a program, and/or a computer. By way of illustration, both an application running on a server and the server can be a component. One or more components can reside within a process and/or thread of execution, and a component can be localized on one computer and/or distributed between two or more computers. Further, components may be communicatively coupled to each other by various types of communications media to coordinate operations. The coordination may involve the uni-directional or bi-directional exchange of information. For instance, the components may communicate information in the form of signals communicated over the communications media. The information can be implemented as signals allocated to various signal lines. In such allocations, each message is a signal. Further embodiments, however, may alternatively employ data messages. Such data messages may be sent across various connections. Exemplary connections include parallel interfaces, serial interfaces, and bus interfaces.

The computing architecture 1200 includes various common computing elements, such as one or more processors, multi-core processors, co-processors, memory units, chipsets, controllers, peripherals, interfaces, oscillators, timing devices, video cards, audio cards, multimedia input/output (I/O) components, power supplies, and so forth. The embodiments, however, are not limited to implementation by the computing architecture 1200.

As shown in FIG. 12, the computing architecture 1200 comprises a processing unit 1204, a system memory 1206 and a system bus 1208. The processing unit 1204 can be any of various commercially available processors, including without limitation an AMD® Athlon®, Duron® and Opteron® processors; ARM® application, embedded and secure processors; IBM® and Motorola® DragonBall® and PowerPC® processors; IBM and Sony® Cell processors; Intel® Celeron®, Core (2) Duo®, Itanium®, Pentium®, Xeon®, and XScale® processors; and similar processors. Dual microprocessors, multi-core processors, and other multi-processor architectures may also be employed as the processing unit 1204.

The system bus 1208 provides an interface for system components including, but not limited to, the system memory 1206 to the processing unit 1204. The system bus 1208 can be any of several types of bus structure that may further interconnect to a memory bus (with or without a memory controller), a peripheral bus, and a local bus using any of a variety of commercially available bus architectures. Interface adapters may connect to the system bus 1208 via a slot architecture. Example slot architectures may include without limitation Accelerated Graphics Port (AGP), Card Bus, (Extended) Industry Standard Architecture ((E)ISA), Micro Channel Architecture (MCA), NuBus, Peripheral Component Interconnect (Extended) (PCI(X)), PCI Express, Personal Computer Memory Card International Association (PCMCIA), and the like.

The system memory 1206 may include various types of computer-readable storage media in the form of one or more higher speed memory units, such as read-only memory (ROM), random-access memory (RAM), dynamic RAM (DRAM), Double-Data-Rate DRAM (DDRAM), synchronous DRAM (SDRAM), static RAM (SRAM), programmable ROM (PROM), erasable programmable ROM (EPROM), electrically erasable programmable ROM (EEPROM), flash memory, polymer memory such as ferroelectric polymer memory, ovonic memory, phase change or ferroelectric memory, silicon-oxide-nitride-oxide-silicon (SONOS) memory, magnetic or optical cards, an array of devices such as Redundant Array of Independent Disks (RAID) drives, solid state memory devices (e.g., USB memory, solid state drives (SSD) and any other type of storage media suitable for storing information. In the illustrated embodiment shown in FIG. 12, the system memory 1206 can include non-volatile memory 1210 and/or volatile memory 1212. A basic input/output system (BIOS) can be stored in the non-volatile memory 1210.

The computer 1202 may include various types of computer-readable storage media in the form of one or more lower speed memory units, including an internal (or external) hard disk drive (HDD) 1214, a magnetic floppy disk drive (FDD) 1216 to read from or write to a removable magnetic disk 1218, and an optical disk drive 1220 to read from or write to a removable optical disk 1222 (e.g., a CD-ROM or DVD). The HDD 1214, FDD 1216 and optical disk drive 1220 can be connected to the system bus 1208 by a HDD interface 1224, an FDD interface 1226 and an optical drive interface 1228, respectively. The HDD interface 1224 for external drive implementations can include at least one or both of Universal Serial Bus (USB) and IEEE 1384 interface technologies.

The drives and associated computer-readable media provide volatile and/or nonvolatile storage of data, data structures, computer-executable instructions, and so forth. For example, a number of program modules can be stored in the drives and memory units 1210, 1212, including an operating system 1230, one or more application programs 1232, other program modules 1234, and program data 1236. In one embodiment, the one or more application programs 1232, other program modules 1234, and program data 1236 can include, for example, the various applications and/or components of apparatus 105, 205, 505, 705, and/or 905.

A user can enter commands and information into the computer 1202 through one or more wire/wireless input devices, for example, a keyboard 1238 and a pointing device, such as a mouse 1240. Other input devices may include microphones, infra-red (IR) remote controls, radio-frequency (RF) remote controls, game pads, stylus pens, card readers, dongles, finger print readers, gloves, graphics tablets, joysticks, keyboards, retina readers, touch screens (e.g., capacitive, resistive, etc.), trackballs, trackpads, sensors, styluses, and the like. These and other input devices are often connected to the processing unit 1204 through an input device interface 1242 that is coupled to the system bus 1208, but can be connected by other interfaces such as a parallel port, IEEE 1384 serial port, a game port, a USB port, an IR interface, and so forth.

A monitor 1244 or other type of display device is also connected to the system bus 1208 via an interface, such as a video adaptor 1246. The monitor 1244 may be internal or external to the computer 1202. In addition to the monitor 1244, a computer typically includes other peripheral output devices, such as speakers, printers, and so forth.

The computer 1202 may operate in a networked environment using logical connections via wire and/or wireless communications to one or more remote computers, such as a remote computer 1248. The remote computer 1248 can be a workstation, a server computer, a router, a personal computer, portable computer, microprocessor-based entertainment appliance, a peer device or other common network node, and typically includes many or all of the elements described relative to the computer 1202, although, for purposes of brevity, only a memory/storage device 1250 is illustrated. The logical connections depicted include wire/wireless connectivity to a local area network (LAN) 1252 and/or larger networks, for example, a wide area network (WAN) 1254. Such LAN and WAN networking environments are commonplace in offices and companies, and facilitate enterprise-wide computer networks, such as intranets, all of which may connect to a global communications network, for example, the Internet.

When used in a LAN networking environment, the computer 1202 is connected to the LAN 1252 through a wire and/or wireless communication network interface or adaptor 1256. The adaptor 1256 can facilitate wire and/or wireless communications to the LAN 1252, which may also include a wireless access point disposed thereon for communicating with the wireless functionality of the adaptor 1256.

When used in a WAN networking environment, the computer 1202 can include a modem 1258, or is connected to a communications server on the WAN 1254, or has other means for establishing communications over the WAN 1254, such as by way of the Internet. The modem 1258, which can be internal or external and a wire and/or wireless device, connects to the system bus 1208 via the input device interface 1242. In a networked environment, program modules depicted relative to the computer 1202, or portions thereof, can be stored in the remote memory/storage device 1250. It will be appreciated that the network connections shown are exemplary and other means of establishing a communications link between the computers can be used.

The computer 1202 is operable to communicate with wire and wireless devices or entities using the IEEE 802 family of standards, such as wireless devices operatively disposed in wireless communication (e.g., IEEE 802.16 over-the-air modulation techniques). This includes at least Wi-Fi (or Wireless Fidelity), WiMax, and Bluetooth™ wireless technologies, among others. Thus, the communication can be a predefined structure as with a conventional network or simply an ad hoc communication between at least two devices. Wi-Fi networks use radio technologies called IEEE 802.11x (a, b, g, n, etc.) to provide secure, reliable, fast wireless connectivity. A Wi-Fi network can be used to connect computers to each other, to the Internet, and to wire networks (which use IEEE 802.3-related media and functions).

One or more aspects of at least one embodiment may be implemented by representative instructions stored on a machine-readable medium which represents various logic within the processor, which when read by a machine causes the machine to fabricate logic to perform the techniques described herein. Such representations, known as "IP cores" may be stored on a tangible, machine readable medium and supplied to various customers or manufacturing facilities to load into the fabrication machines that actually make the logic or processor. Some embodiments may be implemented, for example, using a machine-readable medium or article which may store an instruction or a set of instructions that, if executed by a machine, may cause the machine to perform a method and/or operations in accordance with the embodiments. Such a machine may include, for example, any suitable processing platform, computing platform, computing device, processing device, computing system, processing system, computer, processor, or the like, and may be implemented using any suitable combination of hardware and/or software. The machine-readable medium or article may include, for example, any suitable type of memory unit, memory device, memory article, memory medium, storage device, storage article, storage medium and/or storage unit, for example, memory, removable or non-removable media, erasable or non-erasable media, writeable or re-writeable media, digital or analog media, hard disk, floppy disk, Compact Disk Read Only Memory (CD-ROM), Compact Disk Recordable (CD-R), Compact Disk Rewriteable (CD-RW), optical disk, magnetic media, magneto-optical media, removable memory cards or disks, various types of Digital Versatile Disk (DVD), a tape, a cassette, or the like. The instructions may include any suitable type of code, such as source code, compiled code, interpreted code, executable code, static code, dynamic code, encrypted code, and the like, implemented using any suitable high-level, low-level, object-oriented, visual, compiled and/or interpreted programming language.

The following include examples according to some embodiments:

Example 1 is an apparatus to provide a component interface, the apparatus comprising at least one memory, a first component, a second component, and logic, at least a portion comprised in the first component, the logic to define at least one interface register of the first component and at least one interface field stored in the at least one interface register to generate a component interface between the first component and the second component, and receive interface information from the second component via the component interface, the interface information comprising at least one value for the at least one interface field.

Example 2 is the apparatus of Example 1, the first component comprising a physical (PHY) component.

Example 3 is the apparatus of Example 1, the second component comprising a link management component.

Example 4 is the apparatus of Example 1, the first component comprising a processor to execute a firmware application to operate the first component based at least partially on the interface information.

Example 5 is the apparatus of Example 1, the second component comprising a processor to execute a firmware application to generate the interface information.

Example 6 is the apparatus of Example 1, the interface information comprising a mode of operation of the first component.

Example 7 is the apparatus of Example 1, the logic comprising firmware of the first component.

Example 8 is the apparatus of Example 1, the logic to configure at least one configurable element of the first component based on the interface information.

Example 9 is the apparatus of Example 1, the logic to configure at least one port of the first component based on the interface information.

Example 10 is the apparatus of Example 1, the logic to assign the at least one interface register as writable by the first component and readable by the second component.

Example 11 is the apparatus of Example 1, the logic to assign the at least one interface register as writable only by the second component.

Example 12 is the apparatus of Example 1, the logic to determine a validity of the at least one interface register.

Example 13 is the apparatus of Example 1, the interface information comprising configuration information for at least one configurable element of the first component.

Example 14 is the apparatus of Example 1, the logic to provide status information to the second component over the component interface via the interface information stored in the at least one interface register.

Example 15 is the apparatus of Example 1, the logic to map a plurality of ports of the first component to a plurality of lanes of the first component based on the interface information.

Example 16 is a system to provide a component interface, comprising the apparatus according to any of Examples 1-15, and at least one network interface.

Example 17 is a method to provide a component interface, the method comprising generating a component interface between a first component and a second component of an apparatus by defining at least one interface register of the first component and at least one interface field stored in the at least one interface register, and receiving interface information from the second component via the component interface, the interface information comprising at least one value for the at least one interface field.

Example 18 is the method of Example 17, the first component comprising a physical (PHY) component.

Example 19 is the method of Example 17, the second component comprising a link management component.

Example 20 is the method of Example 17, the first component comprising a processor to execute a firmware application to operate the first component based at least partially on the interface information.

Example 21 is the method of Example 17, the second component comprising a processor to execute a firmware application to generate the interface information.

Example 22 is the method of Example 17, the interface information comprising a mode of operation of the first component.

Example 23 is the method of Example 17, comprising generating the component interface via firmware of the first component.

Example 24 is the method of Example 17, comprising configuring at least one configurable element of the first component based on the interface information.

Example 25 is the method of Example 17, comprising configuring at least one port of the first component based on the interface information.

Example 26 is the method of Example 17, comprising assigning the at least one interface register as writable by the first component and readable by the second component.

Example 27 is the method of Example 17, comprising assigning the at least one interface register as writable only by the second component.

Example 28 is the method of Example 17, comprising determining a validity of the at least one interface register.

Example 29 is the method of Example 17, the interface information comprising configuration information for at least one configurable element of the first component.

Example 30 is the method of Example 17, comprising providing status information to the second component over the component interface via the interface information stored in the at least one interface register.

Example 31 is the method of Example 17, comprising mapping a plurality of ports of the first component to a plurality of lanes of the first component based on the interface information.

Example 32 is a computer-readable storage medium, comprising a plurality of instructions to provide a component interface that, when executed, enable processing circuitry to generate a component interface between a first component and a second component of an apparatus by defining at least one interface register of the first component and at least one interface field stored in the at least one interface register, and receive interface information from the second component via the component interface, the interface information comprising at least one value for the at least one interface field.

Example 33 is the computer-readable storage medium of Example 32, the first component comprising a physical (PHY) component.

Example 34 is the computer-readable storage medium of Example 32, the second component comprising a link management component.

Example 35 is the computer-readable storage medium of Example 32, the first component comprising a processor to execute a firmware application to operate the first component based at least partially on the interface information.

Example 36 is the computer-readable storage medium of Example 32, the second component comprising a processor to execute a firmware application to generate the interface information.

Example 37 is the computer-readable storage medium of Example 32, the interface information comprising a mode of operation of the first component.

Example 38 is the computer-readable storage medium of Example 32, the instructions, when executed, to enable the processing circuitry to generate the component interface via firmware of the first component.

Example 39 is the computer-readable storage medium of Example 32, the instructions, when executed, to enable the processing circuitry to configure at least one configurable element of the first component based on the interface information.

Example 40 is the computer-readable storage medium of Example 32, the instructions, when executed, to enable the processing circuitry to configure at least one port of the first component based on the interface information.

Example 41 is the computer-readable storage medium of Example 32, the instructions, when executed, to enable the processing circuitry to assign the at least one interface register as writable by the first component and readable by the second component.

Example 42 is the computer-readable storage medium of Example 32, the instructions, when executed, to enable the processing circuitry to assign the at least one interface register as writable only by the second component.

Example 43 is the computer-readable storage medium of Example 32, the instructions, when executed, to enable the processing circuitry to determine a validity of the at least one interface register.

Example 44 is the computer-readable storage medium of Example 32, the interface information comprising configuration information for at least one configurable element of the first component.

Example 45 is the computer-readable storage medium of Example 32, the instructions, when executed, to enable the processing circuitry to provide status information to the second component over the component interface via the interface information stored in the at least one interface register.

Example 46 is the computer-readable storage medium of Example 32, the instructions, when executed, to enable the processing circuitry to map a plurality of ports of the first component to a plurality of lanes of the first component based on the interface information.

Example 47 is an apparatus to provide a component interface, the apparatus comprising a memory means to store firmware logic of a first component means, a processor means operably coupled to the memory means, the processor means to execute the firmware logic to define at least one interface register means of the first component means and at least one interface field stored in the at least one interface register means to generate a component interface between the first component and the second component, and receive interface information from a second component means via the component interface, the interface information comprising at least one value for the at least one interface field.

Example 48 is the apparatus of Example 47, the first component means comprising a physical (PHY) component.

Example 49 is the apparatus of Example 47, the second means component comprising a link management component.

Example 50 is the apparatus of Example 47, the firmware logic to operate the first component means based at least partially on the interface information.

Example 51 is the apparatus of Example 47, the second component comprising a second processor means to execute second firmware logic to generate the interface information.

Example 52 is the apparatus of Example 47, the interface information comprising a mode of operation of the first component.

Example 53 is the apparatus of Example 47, the firmware logic comprising firmware of the first component means.

Example 54 is the apparatus of Example 47, the firmware logic to configure at least one configurable element means of the first component means based on the interface information.

Example 55 is the apparatus of Example 47, the firmware logic to configure at least one port means of the first component means based on the interface information.

Example 56 is the apparatus of Example 47, the firmware logic to assign the at least one interface register means as writable by the first component means and readable by the second component means.

Example 57 is the apparatus of Example 47, the firmware logic to assign the at least one interface register means as writable only by the second component means.

Example 58 is the apparatus of Example 47, the firmware logic to determine a validity of the at least one interface register means.

Example 59 is the apparatus of Example 47, the interface information comprising configuration information for at least one configurable element means of the first component means.

Example 60 is the apparatus of Example 47, the firmware logic to provide status information to the second component means over the component interface via the interface information stored in the at least one interface register means.

Example 61 is the apparatus of Example 47, the firmware logic to map a plurality of port means of the first component means to a plurality of lane means of the first component means based on the interface information.

Example 62 is a system to provide a component interface, comprising the apparatus according to any of Examples 47-61, and at least one network interface.

Example 63 is an apparatus to provide a handshaking process for communicating over a component interface, the apparatus comprising at least one memory, a first component, a second component, and logic, at least a portion comprised in the first component, the logic to define a plurality of handshaking registers of the first component readable by the first component and the second component, define at least one register field stored in the plurality of handshaking registers for at least one function of the handshaking process, access a value of the at least one register field, and communicate with the second component using the at least one function based on the value of the at least one field.

Example 64 is the apparatus of Example 63, the first component comprising a physical (PHY) component.

Example 65 is the apparatus of Example 63, the second component comprising a link management component.

Example 66 is the apparatus of Example 63, at least one first register of the plurality of handshaking registers writable only by the first component, and at least one second register of the plurality of handshaking registers writable only by the second component.

Example 67 is the apparatus of Example 63, the at least one function comprising at least one of a request function, a reset function, an acknowledge function, or an error function.

Example 68 is the apparatus of Example 63, the logic to define a set of the plurality of handshaking registers for each of a plurality of elements of the first component, and communicate with the second component using an individual handshaking process for each of the plurality of elements.

Example 69 is the apparatus of Example 63, the logic to define a set of the plurality of handshaking registers for each of a plurality of ports of the first component, and communicate with the second component using an individual handshaking process for each of the plurality of ports.

Example 70 is the apparatus of Example 63, the logic to provide at least one timing requirement to the second component via communication information stored in the plurality of handshaking registers.

Example 71 is the apparatus of Example 63, the logic to provide at least one timing requirement to the second component via communication information stored in the plurality of handshaking registers, the at least one timing requirement comprising at least one of a maximum acknowledgment time, a maximum configuration time, a minimum link time, and a minimum assertion time.

Example 72 is the apparatus of Example 63, the value comprising an assertion or a de-assertion of the at least one register field.

Example 73 is a system to provide a handshaking process for communicating over a component interface, comprising the apparatus according to any of Examples 63-72, and at least one network interface.

Example 74 is a method to provide a handshaking process for communicating over a component interface, the method comprising defining a plurality of handshaking registers of a first component of an apparatus readable by the first component and a second component of the apparatus, defining at least one register field stored in the plurality of handshaking registers for at least one function of the handshaking process, accessing a value of the at least one register field, and communicating with the second component using the at least one function based on the value of the at least one field.

Example 75 is the method of Example 74, the first component comprising a physical (PHY) component.

Example 76 is the method of Example 74, the second component comprising a link management component.

Example 77 is the method of Example 74, at least one first register of the plurality of handshaking registers writable only by the first component, and at least one second register of the plurality of handshaking registers writable only by the second component.

Example 78 is the method of Example 74, the at least one function comprising at least one of a request function, a reset function, an acknowledge function, or an error function.

Example 79 is the method of Example 74, comprising defining a set of the plurality of handshaking registers for each of a plurality of elements of the first component, and communicating with the second component using an individual handshaking process for each of the plurality of elements.

Example 80 is the method of Example 74, comprising defining a set of the plurality of handshaking registers for each of a plurality of ports of the first component, and communicating with the second component using an individual handshaking process for each of the plurality of ports.

Example 81 is the method of Example 74, comprising providing at least one timing requirement to the second component via communication information stored in the plurality of handshaking registers.

Example 82 is the method of Example 74, comprising providing at least one timing requirement to the second component via communication information stored in the plurality of handshaking registers, the at least one timing requirement comprising at least one of a maximum acknowledgment time, a maximum configuration time, a minimum link time, and a minimum assertion time.

Example 83 is the method of Example 74, the value comprising an assertion or a de-assertion of the at least one register field.

Example 84 is a computer-readable storage medium, comprising a plurality of instructions to provide a handshaking process for communicating over a component interface that, when executed, enable processing circuitry to define a plurality of handshaking registers of a first component of an apparatus readable by the first component and a second component of the apparatus, define at least one register field stored in the plurality of handshaking registers for at least one function of the handshaking process, access a value of the at least one register field, and communicate with the second component using the at least one function based on the value of the at least one field.

Example 85 is the computer-readable storage medium of Example 84, the first component comprising a physical (PHY) component.

Example 86 is the computer-readable storage medium of Example 84, the second component comprising a link management component.

Example 87 is the computer-readable storage medium of Example 84, at least one first register of the plurality of handshaking registers writable only by the first component, and at least one second register of the plurality of handshaking registers writable only by the second component.

Example 88 is the computer-readable storage medium of Example 84, the at least one function comprising at least one of a request function, a reset function, an acknowledge function, or an error function.

Example 89 is the computer-readable storage medium of Example 84, the instructions, when executed, to enable the processing circuitry to define a set of the plurality of handshaking registers for each of a plurality of elements of the first component, and communicate with the second component using an individual handshaking process for each of the plurality of elements.

Example 90 is the computer-readable storage medium of Example 84, the instructions, when executed, to enable the processing circuitry to define a set of the plurality of handshaking registers for each of a plurality of ports of the first component, and communicate with the second component using an individual handshaking process for each of the plurality of ports.

Example 91 is the computer-readable storage medium of Example 84, the instructions, when executed, to enable the processing circuitry to provide at least one timing requirement to the second component via communication information stored in the plurality of handshaking registers.

Example 92 is the computer-readable storage medium of Example 84, the instructions, when executed, to enable the processing circuitry to provide at least one timing requirement to the second component via communication information stored in the plurality of handshaking registers, the at least one timing requirement comprising at least one of a maximum acknowledgment time, a maximum configuration time, a minimum link time, and a minimum assertion time.

Example 93 is the computer-readable storage medium of Example 84, the value comprising an assertion or a de-assertion of the at least one register field.

Example 94 is an apparatus to monitor execution of a firmware application, the apparatus comprising at least one memory, a first component, logic, at least a portion comprised in hardware, the logic to generate an execution log stored in at least one monitor register of the first component, determine a plurality of indices for at least a portion of a plurality of execution states of the firmware application, and update the execution log responsive to a determination that the firmware application has entered one of the plurality of execution states by incrementing a pointer of the execution log to indicate a next execution state of the firmware application, and writing an index of the one of the plurality of execution states in the execution log.

Example 95 is the apparatus of Example 94, the first component comprising a physical (PHY) component.

Example 96 is the apparatus of Example 94, the logic to log execution of the firmware application continuously in the execution log, wrapping when the execution log is full.

Example 97 is the apparatus of Example 94, the logic to log a specified number of execution states of the firmware application.

Example 98 is the apparatus of Example 94, the logic to clear the execution log by writing a specified value to the at least one monitor register.

Example 99 is the apparatus of Example 94, the logic to enable monitoring of the firmware application based on a value of an enable/disable bit.

Example 100 is the apparatus of Example 94, the execution log comprising an array of nibbles indicating executed execution steps of the firmware application.

Example 101 is the apparatus of Example 94, the execution log comprising an array of records indicating executed execution steps of the firmware application.

Example 102 is a method to monitor execution of a firmware application, the method comprising generating an execution log stored in at least one monitor register of a first component of an apparatus, determining a plurality of indices for at least a portion of a plurality of execution states of a firmware application of the first component, and updating the execution log responsive to a determination that the firmware application has entered one of the plurality of execution states by incrementing a pointer of the execution log to indicate a next execution state of the firmware application, and writing an index of the one of the plurality of execution states in the execution log.

Example 103 is the method of Example 102, the first component comprising a physical (PHY) component.

Example 104 is the method of Example 102, comprising logging execution of the firmware application continuously in the execution log, wrapping when the execution log is full.

Example 105 is the method of Example 102, comprising logging a specified number of execution states of the firmware application.

Example 106 is the method of Example 102, comprising clearing the execution log by writing a specified value to the at least one monitor register.

Example 107 is the method of Example 102, comprising enabling monitoring of the firmware application based on a value of an enable/disable bit.

Example 108 is the method of Example 102, the execution log comprising an array of nibbles indicating executed execution steps of the firmware application.

Example 109 is the method of Example 102, the execution log comprising an array of records indicating executed execution steps of the firmware application.

Example 110 is a computer-readable storage medium, comprising a plurality of instructions to monitor execution of a firmware application that, when executed, enable processing circuitry to generate an execution log stored in at least one monitor register of a first component of an apparatus, determine a plurality of indices for at least a portion of a plurality of execution states of a firmware application of the first component, and update the execution log responsive to a determination that the firmware application has entered one of the plurality of execution states by incrementing a pointer of the execution log to indicate a next execution state of the firmware application, and writing an index of the one of the plurality of execution states in the execution log.

Example 111 is the computer-readable storage medium of Example 110, the first component comprising a physical (PHY) component.

Example 112 is the computer-readable storage medium of Example 110, the instructions, when executed, to enable the processing circuitry to log execution of the firmware application continuously in the execution log, wrapping when the execution log is full.

Example 113 is the computer-readable storage medium of Example 110, the instructions, when executed, to enable the processing circuitry to log a specified number of execution states of the firmware application.

Example 114 is the computer-readable storage medium of Example 110, the instructions, when executed, to enable the processing circuitry to clear the execution log by writing a specified value to the at least one monitor register.

Example 115 is the computer-readable storage medium of Example 110, the instructions, when executed, to enable the processing circuitry to enable monitoring of the firmware application based on a value of an enable/disable bit.

Example 116 is the computer-readable storage medium of Example 110, the execution log comprising an array of nibbles indicating executed execution steps of the firmware application.

Example 117 is the computer-readable storage medium of Example 110, the execution log comprising an array of records indicating executed execution steps of the firmware application.

Example 118 is an apparatus having a firmware-configurable component element, the apparatus comprising at least one memory, a first component comprising at least one element, and logic, at least a portion comprised in the first component, the logic to define at least one mode register of the first component to store a specified mode for operating the at least one element, define at least one configuration register to store configuration information associated with the specified mode, and configure the at least one element to operate according to the specified mode by resetting the at least one element to a base configuration, and providing mode-specific configuration information to operating registers associated with the at least one element.

Example 119 is the apparatus of Example 118, the first component comprising a physical (PHY) component.

Example 120 is the apparatus of Example 118, the at least one element comprising at least one port of the first component.

Example 121 is the apparatus of Example 118, the at least one element comprising at least one port of the first component, and the mode type comprising at least one of a data rate or a physical medium dependent (PMD) type.

Example 122 is the apparatus of Example 118, the specified mode provided to the at least one mode register by a second component.

Example 123 is the apparatus of Example 118, the specified mode provided to the at least one mode register by a link management.

Example 124 is the apparatus of Example 118, the logic to configure the at least one element responsive to validating the specified mode.

Example 125 is the apparatus of Example 118, the logic to validate the specified mode by determining whether the specified mode is a valid mode for the at least one element.

Example 126 is the apparatus of Example 118, the logic to validate the specified mode by determining whether the specified mode is compatible with at least one other mode of at least one other element of the first component.

Example 127 is the apparatus of Example 118, the logic to access at least a portion of the mode-specific configuration information in an image file associated with the first component.

Example 128 is a method to configure a component element, the apparatus comprising defining at least one mode register of a first component of Example is an apparatus to store a specified mode for operating the at least one element, defining at least one configuration register to store configuration information associated with the specified mode, and configuring the at least one element to operate according to the specified mode by resetting the at least one element to a base configuration, and providing mode-specific configuration information to operating registers associated with the at least one element.

Example 129 is the method of Example 128, the first component comprising a physical (PHY) component.

Example 130 is the method of Example 128, the at least one element comprising at least one port of the first component.

Example 131 is the method of Example 128, the at least one element comprising at least one port of the first component, and the mode type comprising at least one of a data rate or a physical medium dependent (PMD) type.

Example 132 is the method of Example 128, the specified mode provided to the at least one mode register by a second component.

Example 133 is the method of Example 128, the specified mode provided to the at least one mode register by a link management.

Example 134 is the method of Example 128, comprising configuring the at least one element responsive to validating the specified mode.

Example 135 is the method of Example 128, comprising validating the specified mode by determining whether the specified mode is a valid mode for the at least one element.

Example 136 is the method of Example 128, comprising validating the specified mode by determining whether the specified mode is compatible with at least one other mode of at least one other element of the first component.

Example 137 is the method of Example 128, comprising accessing at least a portion of the mode-specific configuration information in an image file associated with the first component.

Example 138 is a computer-readable storage medium, comprising a plurality of instructions to configure a component element that, when executed, enable processing circuitry to define at least one mode register of the first component to store a specified mode for operating the at least one element, define at least one configuration register to store configuration information associated with the specified mode, and configure the at least one element to operate according to the specified mode by resetting the at least one element to a base configuration, and providing mode-specific configuration information to operating registers associated with the at least one element Example 139 is the computer-readable storage medium of Example 138, the first component comprising a physical (PHY) component.

Example 140 is the computer-readable storage medium of Example 138, the at least one element comprising at least one port of the first component.

Example 141 is the computer-readable storage medium of Example 138, the at least one element comprising at least one port of the first component, and the mode type comprising at least one of a data rate or a physical medium dependent (PMD) type.

Example 142 is the computer-readable storage medium of Example 138, the specified mode provided to the at least one mode register by a second component.

Example 143 is the computer-readable storage medium of Example 138, the specified mode provided to the at least one mode register by a link management.

Example 144 is the computer-readable storage medium of Example 138, the logic to configure the at least one element responsive to validating the specified mode.

Example 145 is the computer-readable storage medium of Example 138, the logic to validate the specified mode by determining whether the specified mode is a valid mode for the at least one element.

Example 146 is the computer-readable storage medium of Example 138, the logic to validate the specified mode by determining whether the specified mode is compatible with at least one other mode of at least one other element of the first component.

Example 147 is the computer-readable storage medium of Example 138, the logic to access at least a portion of the mode-specific configuration information in an image file associated with the first component.

It should be noted that the methods described herein do not have to be executed in the order described, or in any particular order. Moreover, various activities described with respect to the methods identified herein can be executed in serial or parallel fashion.

Although specific embodiments have been illustrated and described herein, it should be appreciated that any arrangement calculated to achieve the same purpose may be substituted for the specific embodiments shown. This disclosure is intended to cover any and all adaptations or variations of various embodiments. It is to be understood that the above description has been made in an illustrative fashion, and not a restrictive one. Combinations of the above embodiments, and other embodiments not specifically described herein will be apparent to those of skill in the art upon reviewing the above description. Thus, the scope of various embodiments includes any other applications in which the above compositions, structures, and methods are used.

It is emphasized that the Abstract of the Disclosure is provided to comply with 37 C.F.R. § 1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate preferred embodiment. In the appended claims, the terms "including" and "in which" are used as the plain-English equivalents of the respective terms "comprising" and "wherein," respectively. Moreover, the terms "first," "second," and "third," etc. are used merely as labels, and are not intended to impose numerical requirements on their objects.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. An apparatus, comprising:
   an interface to a physical (PHY) layer component; and
   a media access controller (MAC) component to comprise circuitry, the circuitry configured to execute a firmware of the MAC component to cause the circuitry to:
      define associations between respective ones of a plurality of interface fields of the PHY component and respective ones of a plurality of parameters, the plurality of interface fields to be stored in one or more interface registers of the PHY component;
      determine, based on the associations, that a first interface field of the plurality of interface fields is to store a map between a plurality of ports of the PHY layer component and a plurality of physical lanes of the PHY layer component; and
      write the map to the first interface field of the plurality of interface fields.

2. The apparatus of claim 1, the firmware to write the map to the first interface field of the plurality of interface fields to cause the PHY component to map the respective port of the plurality of ports to the respective physical lane of the plurality of physical lanes of the PHY layer component based on the map.

3. The apparatus of claim 1, the circuitry to execute the firmware to:
   read, in a second interface field of the plurality of interface fields, status information written by the PHY layer component; and
   determine a state of the PHY layer component based on the status information.

4. The apparatus of claim 1, the circuitry to execute the firmware to:
   assign the first interface field as not writable by the PHY layer component, writable by the MAC component, readable by the PHY layer component, and readable by the MAC component.

5. The apparatus of claim 1, the circuitry to execute the firmware to:
   determine, based on the associations, that a second interface field of the plurality of interface fields is to store a second parameter of the plurality of parameters; and
   write a value associated with the second parameter to the second interface field.

6. The apparatus of claim 5, wherein the second parameter is to comprise one or more of: (i) a Physical Medium Dependent (PMD) type of the PHY layer component, (ii) a respective type of a media connected to the respective port, or (iii) a respective length of the media connected to the respective port.

7. The apparatus of claim 1, the circuitry to execute the firmware to:
  determine, based on the associations, that a second interface field of the plurality of interface fields is to store a first mode of operation of a first port of the plurality of ports; and
  write the first mode of operation to the second interface field.

8. The apparatus of claim 1, the circuitry to execute the firmware to:
  determine, based on the associations, that a second interface field of the plurality of interface fields is to store a data rate of a first port of the plurality of ports; and
  write, to the second interface field, the data rate for the first port.

9. The apparatus of claim 1, the circuitry to execute the firmware to:
  determine that a second interface field of the plurality of interface fields is to store a respective data rate of the respective ports; and
  write, to the second interface field, the respective data rates for the ports.

10. A method, comprising:
  defining, by a firmware of a media access controller (MAC) component, associations between respective ones of a plurality of interface fields of a physical (PHY) layer component and respective ones of a plurality of parameters, the plurality of interface fields to be stored in one or more interface registers of the PHY component;
  determining, by the firmware based on the associations, that a first interface field of the plurality of interface fields is to store a map between a plurality of ports of the PHY layer component and a plurality of physical lanes of the PHY layer component; and
  writing, by the firmware, the map to the first interface field of the plurality of interface fields.

11. The method of claim 10, the firmware to write the map to the first interface field of the plurality of interface fields to cause the PHY component to map the respective port of the plurality of ports to the respective physical lane of the plurality of physical lanes of the PHY layer component based on the map.

12. The method of claim 10, further comprising:
  reading, by firmware in a second interface field of the plurality of interface fields, status information written by the PHY layer component; and
  determining, by the firmware, a state of the PHY layer component based on the status information.

13. The method of claim 10, further comprising:
  assigning, by the firmware, the first interface field as not writable by the PHY layer component, writable by the MAC component, readable by the PHY layer component, and readable by the MAC component.

14. The method of claim 10, further comprising:
  determining, by the firmware based on the associations, that a second interface field of the plurality of interface fields is to store a first mode of operation of a first port of the plurality of ports; and
  writing, by the firmware, the first mode of operation to the second interface field to cause the PHY layer component to cause the first port to enter the first mode of operation.

15. The method of claim 10, further comprising:
  determining, by the firmware based on the associations, that a second interface field of the plurality of interface fields is to store a data rate of a first port of the plurality of ports; and
  writing, by the firmware to the second interface field, the data rate for the first port to cause the PHY layer component to configure the first port to operate at the data rate specified by the second interface field.

16. A non-transitory computer-readable storage medium, comprising instructions that, when executed, enable processing circuitry to:
  define, by a firmware of a media access controller (MAC) component, associations between respective ones of a plurality of interface fields of a physical (PHY) layer component and respective ones of a plurality of parameters, the plurality of interface fields to be stored in one or more interface registers of the PHY component;
  determine, by the firmware based on the associations, that a first interface field of the plurality of interface fields is to store a map between a plurality of ports of the PHY layer component and a plurality of physical lanes of the PHY layer component; and
  write, by the firmware, the map to the first interface field of the plurality of interface fields.

17. The non-transitory computer-readable storage medium of claim 16, the instructions, when executed, to enable the processing circuitry to:
  read, by the firmware in a second interface field of the plurality of interface fields, status information written by the PHY layer component; and
  determine, by the firmware, a state of the PHY layer component based on the status information.

18. The non-transitory computer-readable storage medium of claim 16, the instructions, when executed, to enable the processing circuitry to:
  assign, by the firmware, the first interface field as not writable by the PHY layer component, writable by the MAC component, readable by the PHY layer component, and readable by the MAC component.

19. The non-transitory computer-readable storage medium of claim 16, the instructions, when executed, to enable the processing circuitry to:
  determine, by the firmware based on the associations, that a second interface field of the plurality of interface fields is to store a first mode of operation of a first port of the plurality of ports; and
  write, by the firmware, the first mode of operation to the second interface field.

20. The non-transitory computer-readable storage medium of claim 16, the instructions, when executed, to enable the processing circuitry to:
  determine, by the firmware based on the associations, that a second interface field of the plurality of interface fields is to store a data rate of a first port of the plurality of ports; and
  write, by the firmware to the second interface field, the data rate for the first port.

* * * * *